(12) United States Patent
Hanzawa et al.

(10) Patent No.: US 7,054,200 B2
(45) Date of Patent: May 30, 2006

(54) SEMICONDUCTOR DEVICE

(75) Inventors: Satoru Hanzawa, Hachioji (JP); Takeshi Sakata, Kodaira (JP)

(73) Assignee: Hitachi, Ltd., Tokyo (JP)

(*) Notice: Subject to any disclaimer, the term of this patent is extended or adjusted under 35 U.S.C. 154(b) by 185 days.

(21) Appl. No.: 10/602,885

(22) Filed: Jun. 25, 2003

(65) Prior Publication Data

US 2004/0004875 A1 Jan. 8, 2004

Related U.S. Application Data

(60) Continuation of application No. 10/201,317, filed on Jul. 24, 2002, now Pat. No. 6,611,474, which is a division of application No. 09/706,374, filed on Nov. 3, 2000, now Pat. No. 6,452,858.

(30) Foreign Application Priority Data

Nov. 5, 1999 (JP) .......................................... 11-314711

(51) Int. Cl.
*G11C 7/00* (2006.01)

(52) U.S. Cl. ............................ 365/185.23; 365/230.06; 365/185.24

(58) Field of Classification Search ............ 365/185.23, 365/185.24, 230.06
See application file for complete search history.

(56) References Cited

U.S. PATENT DOCUMENTS

| 4,348,747 | A | * | 9/1982 | Takahashi .............. 365/230.06 |
| 4,536,860 | A | * | 8/1985 | Toyoda et al. .............. 365/190 |
| 5,991,221 | A | * | 11/1999 | Ishikawa et al. ............ 365/226 |
| 6,407,959 | B1 | * | 6/2002 | Ishikawa et al. ............ 365/226 |
| 6,452,858 | B1 | | 9/2002 | Hanzawa et al. ...... 365/230.06 |
| 6,480,425 | B1 | | 11/2002 | Yanagisawa et al. .. 365/189.05 |
| 6,501,672 | B1 | | 12/2002 | Sekiguchi et al. ............ 365/72 |
| 6,535,435 | B1 | | 3/2003 | Tanaka et al. ......... 365/189.09 |
| 6,545,525 | B1 | | 4/2003 | Itoh et al. .................... 327/524 |
| 6,545,897 | B1 | | 4/2003 | Fujisawa et al. ....... 365/230.08 |
| 2001/0001598 | A1 | | 5/2001 | Narui et al. ................. 365/149 |
| 2001/0009519 | A1 | | 7/2001 | Fujisawa et al. .............. 365/51 |
| 2001/0028581 | A1 | | 10/2001 | Yanagisawa et al. .. 365/189.05 |
| 2002/0041531 | A1 | | 4/2002 | Tanaka et al. .............. 365/205 |

FOREIGN PATENT DOCUMENTS

| JP | 407057461 A | 3/1995 |
| JP | 02001195879 A | 7/2001 |

OTHER PUBLICATIONS

IEEE International Solid–State Circuits Conference, Digest of Technical Papers, 1972, pp. 10–11.*
IEE Electronics Letters, May 13, 1999, vol. 35, No. 10, pp. 848–850.*
European Solid–State Circuits Conference, Digest of Technical Papers, 1992, pp. 131–134.*
IEEE Journal of Solid–State Circuits, May 2000, vol. 35, No. 5, pp. 691–695.

* cited by examiner

*Primary Examiner*—Viet Q. Nguyen
(74) *Attorney, Agent, or Firm*—Kenyon & Kenyon

(57) ABSTRACT

A semiconductor device to output voltages at three levels to a word driver while alleviating the breakdown voltage in the MOS transistor. This invention is comprised of a breakdown-voltage reducing MOS transistor inserted in the word driver and two NMOS transistors to supply a read-out voltage to a word line. The word driver is moreover controlled by different voltage amplitudes on the main word lines and the common word lines.

11 Claims, 16 Drawing Sheets

WL: WORD LINE
BL: BIT LINE
SL: SENSE LINE

SEMICONDUCTOR DEVICE

This is a continuation of application Ser. No. 10/201,317 filed 24 Jul. 2002, now U.S. Pat. No. 6,611,474 which is division of application Ser. No. 09/706,374 filed 3 Nov. 2000 now U.S. Pat. No. 6,452,858, the contents of which are incorporated herein by reference in their entirety.

BACKGROUND OF THE INVENTION

1. Field of the Invention

This invention relates to a semiconductor device and relates in particular to a semiconductor memory device. More particularly, this invention relates to a semiconductor memory device containing a highly integrated and highly reliable memory utilizing an amplifying memory cell.

2. Description of Related Art

The widely used dynamic random access memory (DRAM) is a single transistor cell utilized as a memory cell and consisting of a single transistor and a single capacitor. However in recent years, as MOS transistors (MOSFET: Metal Oxide Semiconductor Field Effect Transistor) in semiconductor devices become more highly integrated and more miniaturized, the breakdown voltage becomes lower and the operating voltage has also become lower to achieve lower electrical power consumption also becomes lower. In addition, in a DRAM utilizing a single transistor cell, the memory cell itself has no amplifying action so that the read out signal level from the memory cell is small and operation tends to be unstable because of effects from all types of noise.

So, a memory cell utilizing three transistors (hereafter three-transistor cell) and previously used prior to the single transistor cell is again attracting attention as a memory cell capable of delivering a large read-out signal level by an amplifying action. This three-transistor cell is described for instance in the IEEE International Solid-State Conference, DIGEST OF TECHNICAL PAPERS, pp. 10–11, 1972).

This memory cell for example as shown in FIG. 2, is comprised of a read-out NMOS transistor QR, a write NMOS transistor QW, and also a charge holding NMOS transistor QN. The gates of the transistors QR and QW are connected to the word line WL, and the source is connected to the data line DL. The gate of the transistor QN is connected to the drain of the transistor QW, and the source of the transistor QN is connected to the source line SL. The transistor QN, QR drains are also connected. Here, the threshold voltage VTW of the transistor QW is set higher than the threshold voltage VTR of transistor QR, and the data line voltage amplitude is equal to the supply voltage amplitude VDL. In a memory cell configured this way, the word line voltage for the write operation must be a high write voltage VW higher than the threshold voltage VTW, and this value is generally set higher than the supply voltage VDL. Also, the word line voltage for the read operation must be a read voltage VR higher than the threshold voltage VTR, and lower than the threshold voltage VTW and this value is generally set between the supply voltage level VDL and ground potential. Further, the standby state (non-select state) of the word line voltage must be lower than the word line voltage VTR and is set for example at ground potential VSS.

A device having an amplifying memory cell comprised of one capacitor and two transistors (hereafter called capacitive coupling 2-transistor cell) is described in IEEE ELECTRONICS LETTERS 13th May, 1999 Vol. 35 No. 10, pp. 848–850).

This memory cell as shown in FIG. 3, is comprised of a read NMOS transistor QR, a write transistor QW, and also a coupling capacitor Cc for controlling the voltage of the memory cell node N. The transistors QR and QW are in a stacked configuration so this device is characterized by a small surface area. A transistor utilizing the tunnel effect is used as transistor QW so the leak current is small. These components are connected as follows. One end of the capacitor Cc and the gate of transistor QW are connected to the word line WL, and the source of transistor QW is connected to bit line BL. The other end of the capacitor Cc and the drain of the transistor QW are connected to the gate of the transistor QR, and the memory cell node N thus formed. The source of the transistor QR is grounded, and the drain connected to the sense line SL. The word line voltage VW for writing and the word line voltage VR for reading are respectively set in this kind of cell, as described for the three-transistor cell shown in FIG. 2.

However, in the standby state (non-select state), the voltage potential VN (H) for the standby state of the memory cell node N written at the supply voltage level VDL, must be a word line voltage at a lower voltage potential than VTR, for instance the standby voltage −VB must be set lower than the ground voltage VSS. Therefore, in the three-transistor cell and the capacitive coupling type 2-transistor cell as described above, the read and write operation is controlled by a read voltage VR and write voltage VW applied to one word line.

SUMMARY OF THE INVENTION

This invention therefore has the object of achieving a high speed, low current consumption, high integration DRAM for maintaining high reliability. This invention also has the object of providing a semiconductor device containing a highly integrated and highly reliable memory utilizing an amplifying memory cell.

More specifically, this invention is two aspects as described next. The first aspect is a sub-word driver to drive a sub-word line with a 3-value word line voltage, and also a DRAM utilizing this word driver. The second aspect is a high speed, low current consumption, high integration DRAM maintaining high reliability and eliminating the problem of breakdown voltage in MOS transistors with this sub-word driver.

Hereafter, the background of this invention is related in detail while referring to example of the prior art.

Along with the higher integration and lower power consumption of DRAM devices, the delay time in the word line has become a problem. As one means to resolve the delay time problem, a hierarchical word line structure to divide these word lines in order to reduce their capacitive load, drive each line with separate drivers installed on each line, and having drivers installed on the each of the divided word line WL has been proposed. A sub-word driver utilizing such a structure has been described in the European Solid-State Circuits Conference Digest of Technical Papers, pp 131–134, September 1992.

The circuit structure is shown in FIG. 4. The circuit structure SWD enclosed by dashed lines in FIG. 4 is the area of the sub-word driver. A main word line MWLb is connected to the gates of the PMOS transistor Mp1 and the NMOS transistor Mn1. A common word line FXb is connected to the gate of the NMOS transistor Mn2. A common word line FXt is connected to the source of the transistor Mp1, and the sources of the transistors Mn1 and Mn2 are grounded. The main word lines from the drains of the transistors Mp1, Mn1, Mn2 connect to the branching sub-word line SWL.

The operation of the circuit of FIG. 4 is next described by referring to FIG. 5. When the main, word line MWLb at the high level supply voltage VDL is driven to a low level, ground level VSS, the common word line FXt at ground potential VSS is driven to supply voltage level VDL so that as shown in FIG. 4, the transistor Mp1 for the sub-word driver conducts and, the sub-word line SWL at ground potential VSS is driven to select status at supply voltage VDL. In this way, the voltage level of the sub-word line SWL of the prior art sub-word driver is driven to one of two levels: a high level or a low level.

As related above, a memory array using a three-transistor cell or capacitive coupling 2-transistor cell having low voltage operation, must set the word line to three values. Therefore, a sub-word driver capable of driving the sub-word line to voltage levels of three values is required in order to use this hierarchical word line structure. The gate oxidation film of the MOS transistors in the peripheral circuits should preferably be made thin to prevent a drop in MOS transistor performance even during low voltage operation. Due to these factors, the maximum permissible electric field of the oxidation film of the MOS transistors in the applicable peripheral circuits therefore tends to drop.

However, when a MOS transistor having the same oxidation film thickness (tox), as the peripheral transistors is used in sub-word drivers, the sub-word line voltage amplitude for the three values required for the capacitive coupling 2-transistor cell, as related above, is larger than the supply voltage amplitude so that the MOS transistor breakdown voltage problem is unavoidable.

This invention resolves the above described problems.

In a typical example of the invention to achieve the above objects, a semiconductor device has a plurality of word lines, a plurality of data lines intersecting with the plurality of word lines, a plurality of memory cells installed at desired cross points of the plurality of data lines and plurality of words lines, and a plurality of word drivers to drive the plurality of word lines, wherein each of the plurality of word drivers has a first conduction first MOS transistor supplied with a first voltage to either the source or the drain, a second conduction first MOS transistor supplied with a second voltage to either the source or the drain, a second conduction second MOS transistor supplied with a second voltage to either the source or the drain for at least the desired time, a second conduction third MOS transistor supplied with a third voltage to either the source or drain, a second conduction fourth MOS transistor connected at either the source or the drain to the other source or drain of the second conduction third MOS transistor, and each of the plurality of word drivers outputs any one of the first voltage, the second voltage or third voltage.

The "MOS transistor or MOSFET" of these specifications are abbreviated terms signifying an insulated gate, metal-oxide-semiconductor field-effect-transistor.

DETAILED DESCRIPTION

Figure 1:
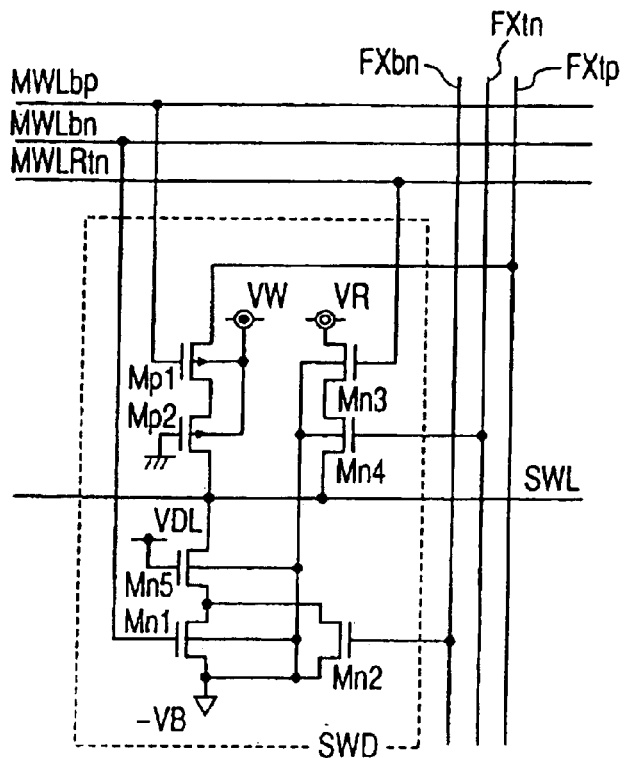
FIG. 1 is a schematic diagram of the sub-word driver for generating the third value voltage level.
Figure 2:
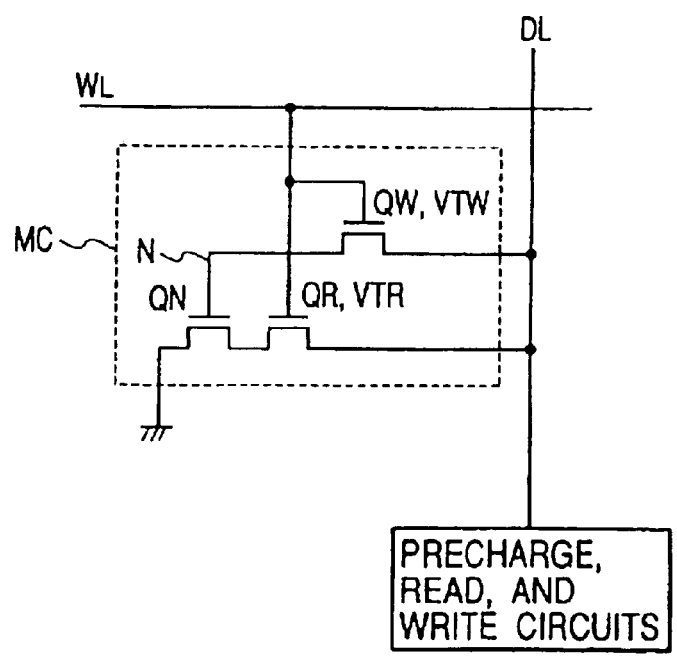
FIG. 2 is a drawing showing an example of the memory cell comprised of three transistors.

First, an overall description of the embodiments of the invention is given and then working examples of those embodiments are explained in detail. A semiconductor device utilizing a hierarchical word line structure is comprised of a plurality of sub-word lines, a plurality of data lines installed to intersect with the plurality of sub-word lines, a main word line installed roughly in parallel with the plurality of sub-word lines, a plurality of common word lines installed to intersect with the plurality of sub-word lines, a plurality of memory cells for exchanging signals with the data lines selected by word lines installed at the desired cross points of the plurality of data lines and plurality of sub-word lines, a plurality of sub-word drivers to drive each of the plurality of sub-word lines selected by the applicable common word line and main word line installed at the desired cross point of the plurality of common word lines and plurality of main word lines, a read circuit to amplify the signal from the memory cell set according to the plurality of data lines, and a write circuit to write the signal from the memory cell set according to the plurality of data lines, wherein each of the plurality of sub-word drivers generates a first word line voltage for the write operation, each of the plurality of sub-word drivers generates a second word line voltage for the standby state, each of the plurality of sub-word drivers generates a third word line voltage for the read operation, and the semiconductor device is further configured so that the voltage applied to the gate oxidation film of the MOS transistors comprising the plurality of sub-word drivers is sufficiently small. More specifically the following methods are utilized.

In a first method, three respective of main word lines and common word lines are set in pairs. A first main word line is connected to the gate of the first PMOS transistor among the sub-word drivers. A first common word line is connected to the source of the a first PMOS transistor, and when the first PMOS transistor is conducting, the first word line voltage is applied from the first common word line, to the applicable sub-word line by way of the first PMOS transistor drain.

In a second method, the second main word line among the main word lines is connected to the gate of the first NMOS transistor among the sub-word drivers, and the source of the first NMOS transistor connected to the standby voltage −VB. When the second NMOS transistor is conducting, the second word line voltage is applied to the sub-word line by way of the drain of the first NMOS transistor.

In a third method, a second common word line from among the common word lines is connected to the gate of the second NMOS transistor from among the sub-word drivers. The source of the second NMOS transistor is connected to the standby voltage −VB. When the second NMOS transistor is conducting, the second word line voltage is applied to the sub-word line by way of the drain of the second NMOS transistor.

In a fourth method, the third main word line from among the main word lines is connected to the gate of the third NMOS transistor from among the sub-word drivers. A third word line voltage is applied to the source of the third NMOS transistor. A third common word line of the common word line is connected to the gate of the fourth NMOS transistor from among the sub-word drivers. The drain of the third NMOS transistor is connected to the source of the fourth NMOS transistor, and when the third NMOS transistor and fourth NMOS transistor are both conducting, the third word line voltage is applied to the sub-word line by way of the fourth NMOS transistor, so the voltage across the gate and drain of the third NMOS transistor is in this way reduced.

In a fifth method, a first main word line of the main word lines is connected to the gate of the first PMOS transistor among the sub-word drivers. A second main word line of the main word lines is connected to the gate of the first NMOS transistor among the sub-word drivers. The voltages for the gate electrode of the first PMOS transistor and the gate electrode of the first NMOS transistor are separated, and the voltage across the gate and source of the applicable MOS transistors in this way reduced.

In a sixth method, a first common word line of the common word lines is connected to the source of the first PMOS transistor among the sub-word drivers. A third common word line of the common word lines is connected to the gate of the fourth NMOS transistor among the sub-word drivers. The voltage of the gate electrode third NMOS transistor and the source electrode of the first PMOS transistor are separated, and the voltage across the gate and source of the first PMOS transistor and the voltage across the gate and drain of the fourth NMOS transistor are in this way reduced.

In a seventh method, a second PMOS transistor applied with a fixed voltage at the gate electrode, is inserted between the applicable sub-word line and the drain of the first PMOS transistor of the sub-word drivers, and the voltage across the gate and drain of the applicable PMOS transistor in this way reduced.

In an eighth method, a fifth NMOS transistor applied with a fixed voltage at the gate electrode is inserted between the applicable sub-word line and the drain of the first NMOS transistor of the sub-word drivers, or the drain of a second NMOS transistor among the sub-word drivers, and the voltage across the gate and drain of the applicable NMOS transistor in this way reduced.

By a combination of the above eight methods, the sub-word driver can generate a three-value word line voltage. Further, the voltage applied to the gate oxidation film of the MOS transistors comprising the sub-word driver can be kept sufficiently small.

The first embodiment is as described next. A detailed example of the first embodiment is explained as shown below.

A semiconductor device has a plurality of word lines, a plurality of data lines installed to intersect with the plurality of word lines, a plurality of memory cells installed at the desired cross points of the plurality of data lines and plurality of word lines, a plurality of word drivers to drive the plurality of word lines, and each of the plurality of word drivers (SWD) is comprised of a first conduction first MOS transistor (Mp1) supplied at either the drain or the source with a first voltage (VW), a second conduction first MOS transistor (Mn1) applied at either the drain or the source with a second voltage (−VB), a second conduction second MOS transistor (Mn2) applied at either the drain or the source with a second voltage (−VB), a second conduction third MOS transistor (Mn3) applied at either the drain or the source with a third voltage (VR), a second conduction fourth MOS transistor (Mn4) connected at either the drain or source, to either of the other drain or source of a second conduction third MOS transistor (Mn3), and characterized in that each of the plurality of word drivers outputs any of a first voltage, a second voltage or a third voltage.

A semiconductor device of the second embodiment, according to the first embodiment is characterized in that each of the plurality of word drivers outputs a first voltage to the applicable word line when the first conduction first MOS transistor is conducting, and outputs a third voltage to the applicable word line when the second conduction third MOS transistor as well as the fourth MOS transistor are conducting, and in other cases a second voltage is output to the applicable word line.

The third embodiment is as follows.

A specific example of the third embodiment is shown in FIG. 1.

A semiconductor device of the first embodiment, characterized in that the plurality of word drivers comprise a first conduction second MOS transistor (Mp2) connected with the word line and with the other source or drain of the first conduction first MOS transistor (Mp1), and a second conduction fifth MOS transistor (Mn5) connected between the word line and the other source or drain of the second conduction first MOS transistor (Mn1) as well as the second conduction second MOS transistor (Mn2), and a fourth voltage (Vss) is applied to the gate of the first conduction second MOS transistor (Mp1) and a fifth voltage (VDL) is applied to the gate of the fifth MOS transistor.

Here, a circuit need not always comprise the Mp1 and Mn5 transistors which may not be required.

The fourth embodiment is as follows. A specific example is described by means of the second embodiment.

In this example, a semiconductor device having a plurality of word lines, a plurality of data lines intersecting with the plurality of word lines, a plurality of memory cells installed at desired cross points of the plurality of data lines and plurality of words lines, and a plurality of word drivers installed to drive each of the plurality of word lines, and each of the plurality of word drivers has a first conduction first MOS transistor (Mp1) supplied at either the source or the drain with a first voltage (VW) for a desired period, a second conduction first MOS transistor (Mn1) applied at either the source or the drain with a second voltage (−VB), a second conduction second MOS transistor (Mn2) applied at either the source or the drain with a second voltage (−VB), a second conduction third MOS transistor (Mn3) applied at either the source or the drain with a third voltage (VR) for a desired period, and the semiconductor device is characterized in that each of the plurality of word drivers outputs any one voltage selected from among the first voltage, the second voltage or third voltage.

The semiconductor device of the fifth embodiment according to the fourth embodiment, is characterized in that each of the plurality of word drivers; outputs a first voltage (VW) to the applicable word line when a first voltage VW is supplied to the drain or source of the first conduction first MOS transistor (Mp1); outputs a second voltage (−VB) to the applicable word line when a second conduction first MOS transistor (Mn1) or a second conduction second MOS transistor (Mn2) are conducting; and outputs a third voltage (VR) to the applicable word line when the second conduction third MOS transistor is conducting and a third voltage (VR) is applied to the source or the drain of that second conduction third MOS transistor, and in other cases a second voltage (−VB) is output to the applicable word line.

The sixth embodiment is described next. A specific example is given by way of embodiment 3 or embodiment 4.

In this example, a semiconductor device is comprised of a plurality of word lines, a plurality of data lines intersecting with the plurality of word lines, a plurality of memory cells installed at desired cross points of the plurality of data lines and plurality of words lines, and a plurality of word drivers installed to drive each of the plurality of word lines; and each of the plurality of word drivers is comprised of a first conduction first MOS transistor supplied at either the source or the drain with a first voltage (VW) in a first period and a third voltage (VR) at a second period, a second conduction first MOS transistor applied at either the source or drain with a second voltage (−VB), a second conduction second MOS transistor applied at the source or drain for at least a specified desired period with a second voltage (−VB) and the semiconductor device is characterized in that each of the plurality of word drivers outputs any one voltage selected from among the first voltage, the second voltage or third voltage.

A fixed voltage input to the source or drain of the transistor Mn2 will also serve adequately here as the second voltage (−VB).

The semiconductor device of the seventh embodiment according to the sixth embodiment is characterized in that each of the plurality of word drivers outputs a first voltage (VW) to the applicable word line when the first conduction first MOS transistor is conducting; outputs a third voltage (VR) to the applicable word line when the first conduction first MOS transistor is conducting in a second period; and in other cases outputs a second voltage (−VB) to the applicable word line.

The semiconductor device of the eighth embodiment according to the sixth embodiment, has a plurality of word drivers comprising a first conduction second MOS transistor (Mp2) between the word line and the other source or drain of the first conduction first MOS transistor, a second conduction fifth MOS transistor (Mn5) between the word line and the other source or drain of the second conduction first MOS transistor and the second conduction second MOS transistor, and further characterized in that a fourth voltage (VSS) is applied to the gate of the first conduction second MOS transistor, and a fifth voltage (VDL) is applied to the gate of the second conduction fifth MOS transistor.

The semiconductor device of the ninth embodiment according to the first through eighth embodiments is characterized in that the material comprising the region contacting the first conduction first MOS gate transistor oxidation film is different from the material comprising the region contacting the first conduction MOS gate transistor oxidation film contained in circuits to drive the gate electrode of the first conduction first MOS transistor.

The semiconductor device of the tenth embodiment according to the first through eighth embodiments is characterized in that first voltage (VW) is larger than the third voltage (VR), and that the third voltage is larger than the second voltage (−VB).

The semiconductor device of the eleventh embodiment according to the third through eighth embodiments is characterized in that first voltage (VW) is larger than the third voltage (VR), and that the third voltage is larger than the second voltage (−VB), and that the fourth voltage (VSS) is a voltage level between the second voltage and the third voltage, and that the fifth voltage (VDL) is a voltage level between the first voltage and the third voltage.

The semiconductor device of the twelfth embodiment according to the first through eighth embodiments is characterized in that each of the plurality of memory cells perform the write operation when the applicable word line is a first voltage; holds the data when the applicable word line is a second voltage; and perform read operation when the applicable word line is at a third voltage.

The semiconductor device of the thirteenth embodiment according to the first through eighth embodiments is a dynamic three-transistor cell, characterized in that the plurality of memory cells are a first MOS transistor connected at the gate to the word line and having either a source or a drain connected to the data line, a second MOS transistor connected at the gate to either of the sources or drains of the first MOS transistor, and a third MOS transistor connected at the gate to the word line and connected at either of the drains or sources to either of the drains or sources of the second MOS transistor.

The semiconductor device of the fourteenth embodiment according to the first through eighth embodiments is a dynamic capacitive coupling 2-transistor cell, characterized in that the plurality of memory cells are a first MOS transistor connected at the gate to the word line and having either a source or a drain connected to the data line, a coupling capacitor connected to one terminal of the word line, and a second MOS transistor with a gate connected to the other terminal of the coupling capacitor and to either of the source or the drain of the first MOS transistor.

As is the normal practice, the first conduction type is a P type and the second conduction type is an N type.

The embodiments of the invention are hereafter described in detail.

First, the embodiment of the invention when utilizing a capacitive coupling 2-transistor cell in the memory cell is described in detail.

Figure 6:
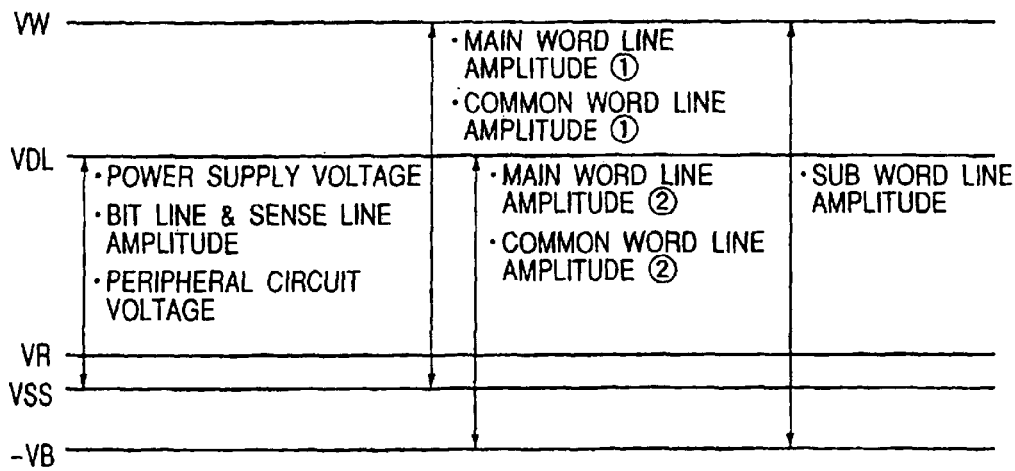
FIG. 6 is a drawing showing typical preferred voltage settings in the capacitive coupling type 2-transistor cell DRAM.

The following explanation assumed the voltage settings shown in FIG. 6. Typical voltage settings for a DRAM utilizing a capacitor coupled transistor cell are shown in FIG. 6. The upper and low positions of the voltage high and low points are shown in the figure. In other words, the supply voltage is set as VDL, the high level of the bit lines, sense lines and peripheral circuits are set as VDL, the low level of the bit lines, sense lines and peripheral circuits are set as ground potential VSS, the first high level of the main word line and common word lines set as VW (hereafter write voltage), the first low level of the main word line and common word lines set as ground potential VSS, the second high level of the main word line and common word line set as supply voltage VDL, the second low level of the main word line and common word line set as −VB (hereafter standby voltage), the first high level of the sub-word line set as the write voltage VW, the sub-word line low level set as standby voltage −VB, and the second high level of the sub-word line (hereafter read voltage) is set as VR.

The maximum electric field strength in the oxidation film of the MOS transistor must generally be set as Eox max=4.5 [MV/cm] from the viewpoint of reliability of the gate insulation film. The allowable gate oxidation film thickness allowed in the PMOS transistor and NMOS transistor of the sub-word driver at this time is expressed as toxp and toxn. The absolute value of the PMOS transistor and NMOS transistor threshold voltages are assumed here to respectively be |Vthp|=−0.3 [V] and |Vthn|=0.3 [V].

Also in these specifications, when there is no particular explanation to the contrary, the gate electrode material of the PMOS transistor within the peripheral circuit is normally P plus silicon doped with a sufficient concentration of acceptors (hereafter, p+Si), and for the NMOS transistor is N plus silicon sufficiently doped with donors (hereafter n+Si). This material is intended to lower the MOS transistor threshold voltage without using a larger ion implantation quantity to adjust the threshold voltage. The gate electrode material here, is material for the portion contacting the gate oxidation film within the gate electrode. For example, the gate material was described above as p+Si, there is no need for the entire gate to be p+Si and for instance a dual layer structure of p+Si and a high fusing point material such as tungsten may be utilized.

In such a case, when the supply voltage of the peripheral circuits is set as VDL=1.5 [V], then the allowable gate oxidation film thickness tox in the peripheral circuits is set as, $$tox = VDL \div Eox\ max = 1.5\ [V] \div 4.5\ [MV/cm] \approx 3.3\ [nm]$$

However, in actual operation, the thickness must be set to a degree that prevents the occurrence of tunnel current flowing in the gate oxidation film, and is estimated as approximately 5 [nm].

<First Embodiment>

Figure 7:
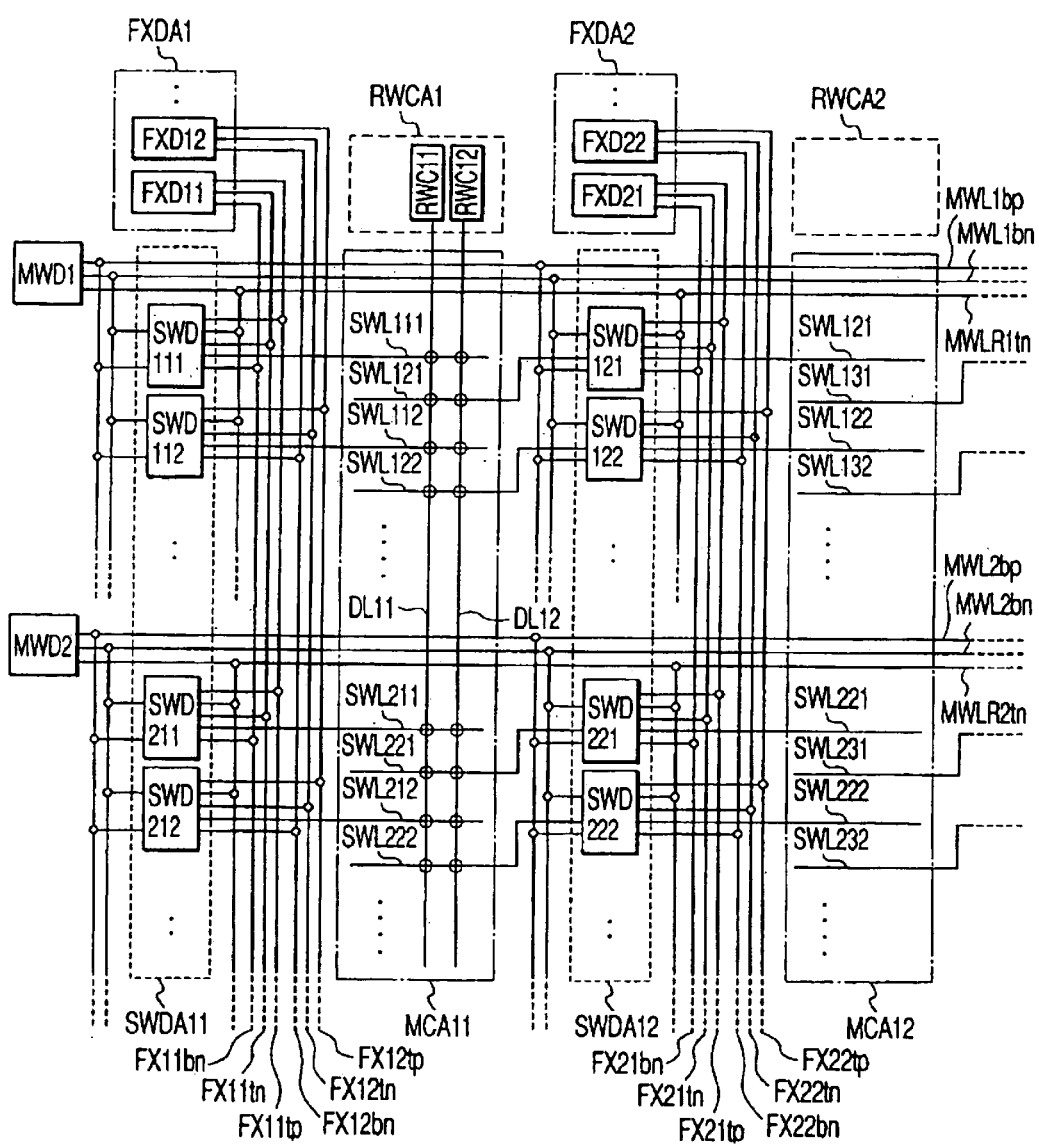
FIG. 7 is a circuit diagram showing a portion of the hierarchical word line structure of the first embodiment.
Figure 8:
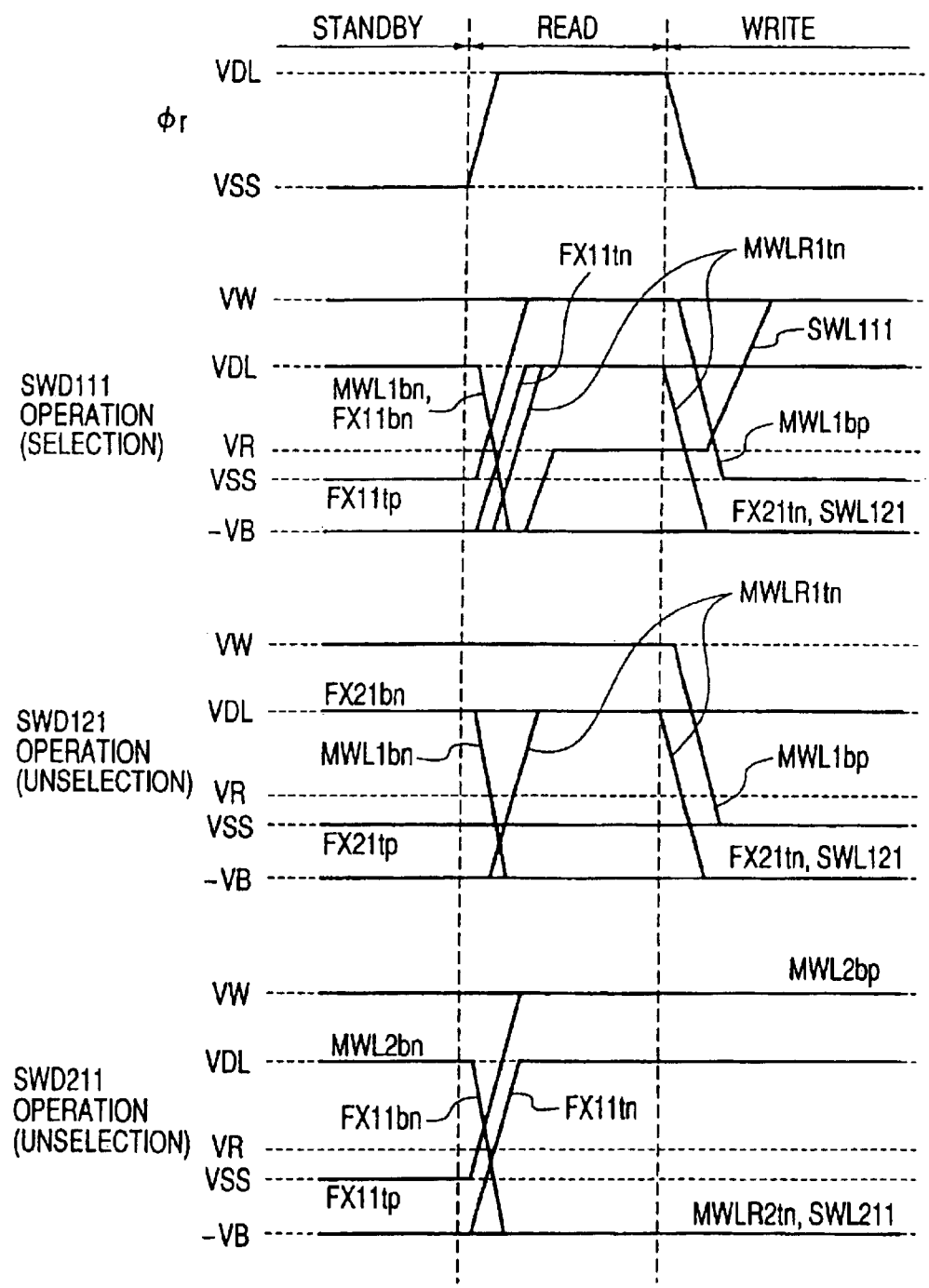
FIG. 8 is a drawing showing operating timing diagrams of sub-word drivers generating three value voltage levels.
Figure 9:
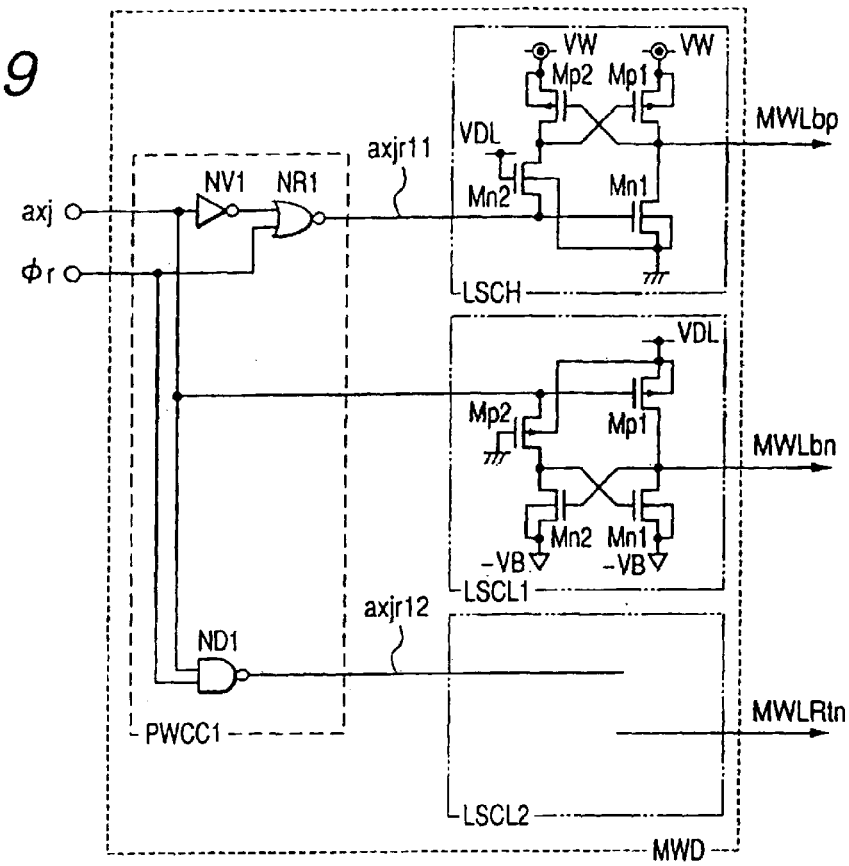
FIG. 9 is a drawing showing the circuit diagram of the main word driver of the first embodiment.
Figure 10:
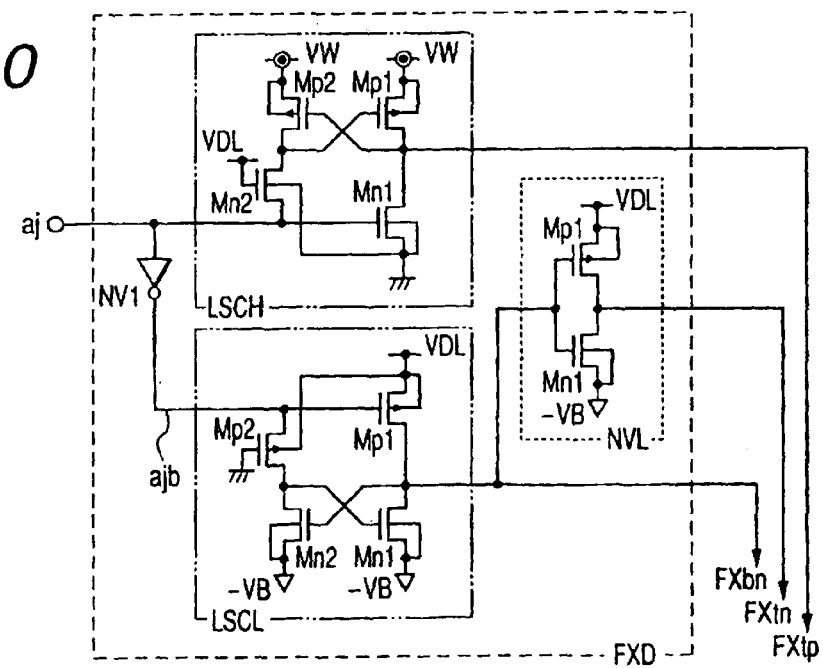
FIG. 10 is a circuit diagram of the common word driver circuit.
Figure 11:
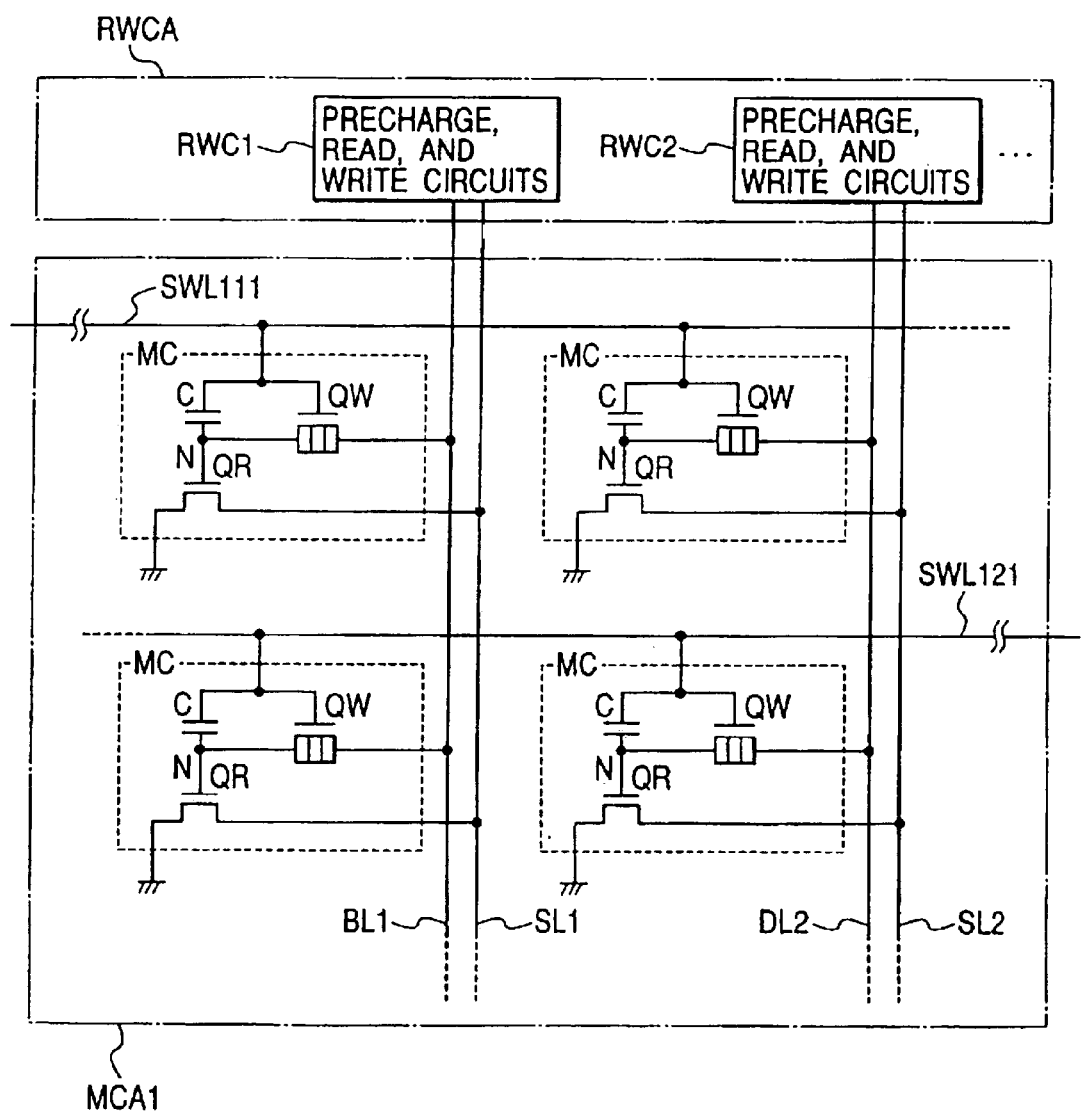
FIG. 11 is a drawing showing a typical memory cell array.
Figure 12:
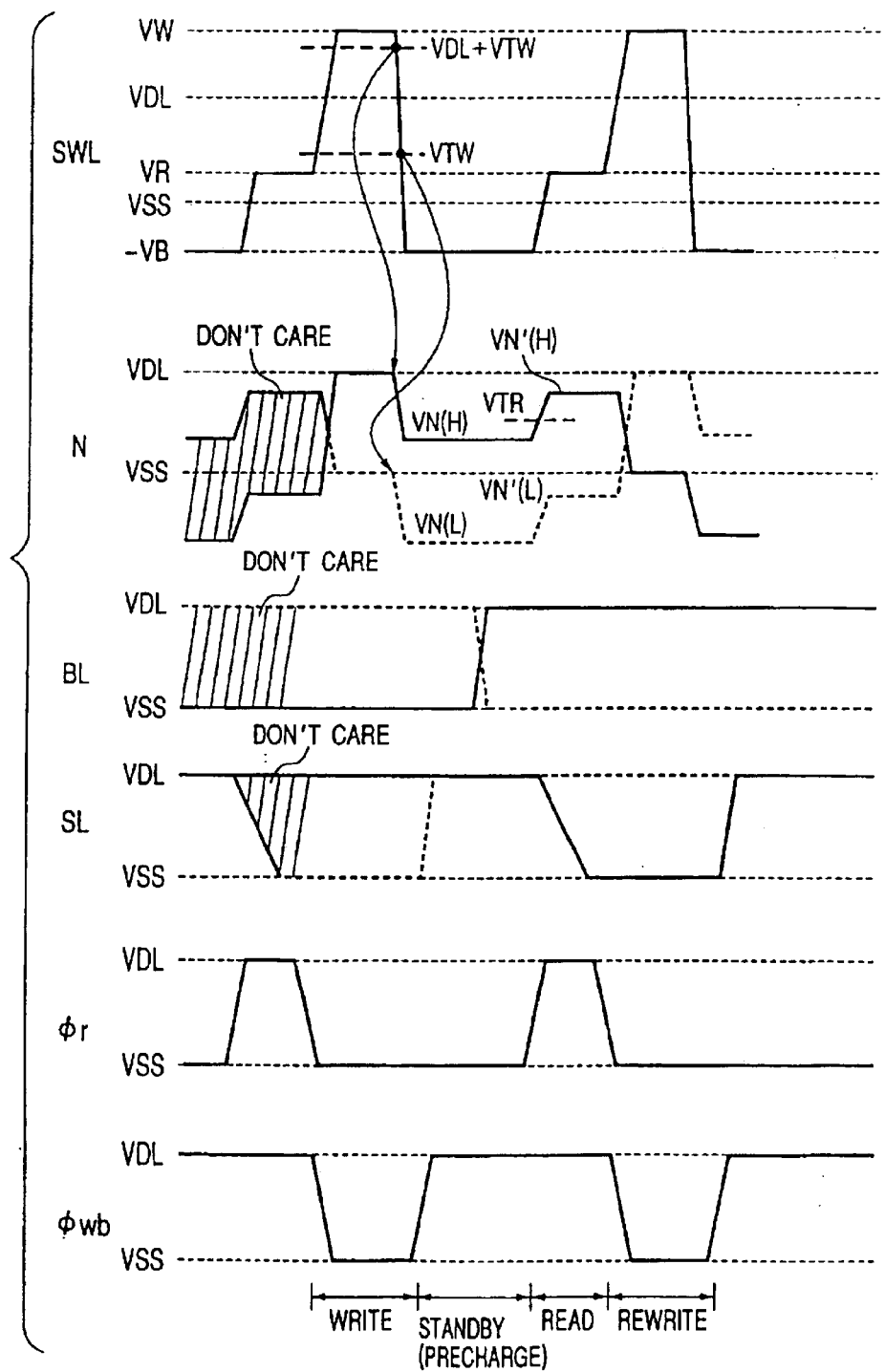
FIG. 12 is operation timing diagrams of the memory cell comprised of two transistors and one capacitor.

The first embodiment is described while referring to FIG. 1, and FIG. 7 through FIG. 12. The drawing in FIG. 1 shows the configuration of the sub-word driver for driving the sub-word lines to the three voltage values. FIG. 7 shows a typical configuration of the DRAM hierarchical word line structure of this invention. FIG. 8 is a drawing illustrating the operation of the sub-word driver of FIG. 1. FIG. 9 is a drawing showing the configuration of the main word driver circuit for the semiconductor storage device. FIG. 10 is a drawing showing the common word driver structure. FIG. 11 is a drawing showing a typical memory cell array utilizing the capacitive coupling 2 transistors shown in FIG. 5. FIG. 12 is a drawing showing the operation timing of the memory cell comprised by utilizing two transistors and one capacitor.

The hierarchical word structure is described next while referring to FIG. 7. The sub-word drivers SWD (SWD111, SWD112, . . . ) respectively controlling the separate sub-word lines SWL (SWL111, SWL112 . . . ) are respectively installed at cross points of the main word lines MWLbp (MWL1bp, MWL2bp, . . . ), MWLbn (MWL1bn, MWL2bn, . . . ), MWLRtn (MWLR1tn, MWLR2tn, . . . ) and common word lines FXtp (FX11tp, FX12tp, . . . ) FXtn (FX11tn, FX12tn, . . . ), FXbn (FX11bn, FX12bn, . . . ). These sub-word drivers SWD are comprised of a plurality of units of sub-word driver arrays SWDA (SWDA11, SWDA12, . . . ).

The sub-word lines SWL are connected to the memory cell array MCA (MCA11, MCA12, . . . ) The write control circuit arrays RWCA (RWCA1, RWCA2, . . . ) comprised of a plurality of units of write control circuits RWC (RWC11, RWC12, . . . ) are located adjacent to these memory cell arrays. The main word lines MWLbp, MWLbn, MWLRtn are driven by the main word drivers MWD (MWD1, MWD2, . . . ), and cross above the sub-word driver arrays SWDA and the memory cell arrays MCA.

The main word lines here are comprised of complementary true (non-inverted) and bar (inverted) signals and identified from each other by the appended letters t and b of the reference signals. The (true) non-inverted signals are for the PMOS transistors and the (bar) inverted signals are for the NMOS transistor signals, and are identified by the appended letters p and n of the respective reference signals. The sets of common word lines FXtp, FXtn as well as FXbn are driven by the common word drivers FXD (FXD11, FXD12, . . . ) and their common word drivers FXD are comprised of a plurality of units of common word driver arrays FXDA (FXDA1, FXDA2, . . . ). The main word driver array MWDA and common word driver array FXDA are installed at the periphery of the sub-word driver array SWDA and memory cell array MCA as well as write control circuit array RWCA.

The relation of sub-word line and memory cell, is where the memory cell is connecting with the sub-word line at the position shown by the white circles at the intersection of the sub-word lines SWL and data lines DL in the memory cell arrays MCA (MC11, MC12, . . . ).

Figure 3:
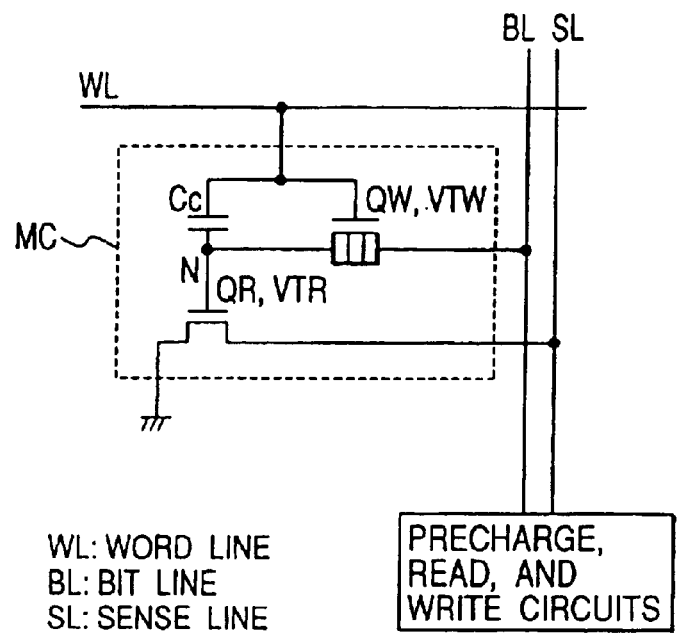
FIG. 3 is a drawing showing an example of the memory cell comprised of two transistors and one capacitor.
Figure 4:
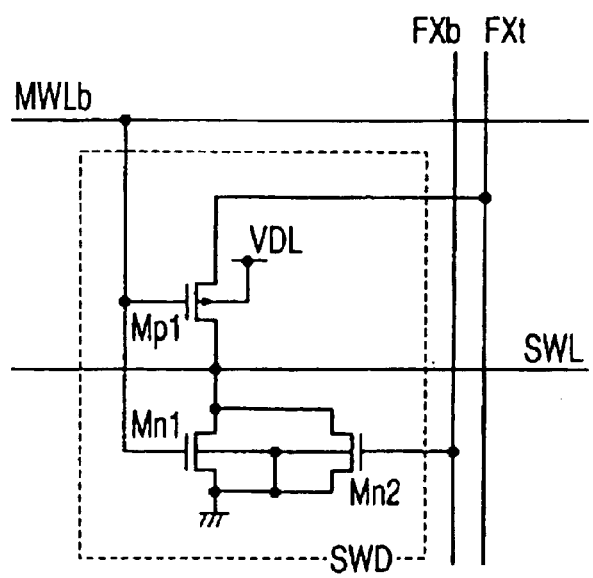
FIG. 4 is a drawing showing the circuit of the sub-word driver of the related art.

This memory cell is the three-transistor cell shown in FIG. 4 as described above. In the case of the capacitive coupling 2-transistor cell shown in FIG. 3, a bit line BL and a sense line SL are installed instead of the data line DL. The write control circuits RWC (RWC11, RWC12, . . . ) are connected at the end of the data line DL (DL11, DL12, . . . ).

Though not shown in FIG. 7, the circuit of FIG. 7 is provided with an address input signal terminal and an address decoder for controlling selection of the memory cell that performs read operation, and this circuit also issues a decode signal decoded from the address signal that was input to the address decoder. This decode signal functions to activate the main word driver MWD and common word driver FXD for specifying the sub-word line SWL contained in the selected memory cell.

<Sub-Word Driver Structure>

The structure of the sub-word driver SWD of this invention for driving the sub-word lines to the three voltage values is shown in FIG. 1. In this figure, signals for conduction by majority carriers in P type MOS transistors are identified by means of the attached arrows and the signals for the N type MOS transistors are identified by having no arrows.

The PMOS transistor Mp1 and the NMOS transistor Mn1 are handled with separate main word line signals. The gate of the PMOS transistor Mp1 is connected to main word line MWLbp, while the gate of the NMOS transistor Mn1 is connected to the main word line MWLbn. The gate of the NMOS transistor Mn3 is also connected to the main word line MWLRtn. The PMOS transistor Mp1 and the NMOS transistor Mn4 are also handled with separate common word lines. The source of the PMOS transistor is connected to the common word line FXtp, and the gate of the NMOS transistor Mn4 is connected to the common word line FXtn. The gate of the NMOS transistor Mn2 is connected to the common word line FXbn. The sources of the NMOS transistors Mn1 and Mn2 are connected to the standby voltage −VB, and a read voltage VR is input to the source of the NMOS transistor Mn3. The PMOS transistor Mp2 and the NMOS transistor Mn5 are oxide-stress relaxation MOS transistors, and a fixed voltage is input to the gate electrodes. FIG. 1 shows respective application of ground potential VSS and supply voltage VDL. The transistor Mn4 also fulfills the function of an oxide-stress relaxation MOS transistor. The sub-word line SWL is connected to the drains of the transistors Mp2, Mn4 and Mn5.

<Sub-Word Driver Operation>

The operation of the sub-word driver SWD of FIG. 1 is explained while according to FIG. 8.

FIG. 8 shows the operation when the sub-word line SWL111 is selected. The read operation and write operation are carried out in succession from standby state. First of all, when the read control signal φr at ground potential VSS is driven to read status at supply voltage level VDL, the main word driver MWD1 drives the main word line MWL1*bn* from supply voltage level VDL to standby voltage −VB and the main word line MWLR1 from standby voltage −VB too supply voltage VDL. Also, the common word driver FXD11 drives the common word line FX11*tp* and FX11*tn* from respectively ground potential VSS and standby voltage −VB, to respectively the write voltage VW and the supply voltage level VDL. The main word line MWL1*bp* is therefore driven to the write voltage VW, the main word line MWL1*bn* is driven to the standby voltage −VB, and the main word line MWLR1*tn* is driven to the supply voltage VDL. Also, the common word line FX11*tp* is driven to the write voltage VW, the common word line FX11*tn* is driven to supply voltage level VDL and the common word line FX11*bn* is driven to the standby voltage −VB so that the transistors Mn3, Mn4 start conduction and the sub-word driver SWD111 is selected and the sub-word line SWL111 is driven from the standby voltage −VB to read voltage VR.

Next, when the read control signal φr at supply voltage level VDL is driven to ground potential VSS, the main word driver MWD1 drives the main word line MWL1*bp* from write voltage VW to ground potential VSS, and the main word line MWLR1*tn* at the supply voltage VDL is driven to standby voltage −VB. The main word line MWL1*bp* is therefore driven to ground potential VSS, the main word line MWL1*bn* is driven to the standby voltage −VB, the main word line MWLR1*tn* is driven to standby voltage −VB. Further, the common word line FX11*tp* is driven to the write voltage VW, the common word line FX11*tn* is driven to supply voltage VDL, and the common word line FX11*bn* is driven to the standby voltage −VB so that the transistors Mp1, Mp2 start to conduct and the sub-word driver SWD111 is selected. This sub-word line SWL111 at the read voltage VR, is driven to the write voltage VW.

In this way, in the operation that selects the sub-word driver SWD111, the non-selected sub-word drivers are in the following three states. In other words, firstly, the main word line and the common word line are both in non-select status, secondly the common word line selected by the main word line is in non-select status, and thirdly with the main word line in non-select status the common word line is in select status. Hereafter, these states are explained in order.

Firstly, the state when the main word line and the common word line are both in non-select status is explained. During standby, all sub-word drivers SWD are in this non-select status. When the sub-word driver SWD111 is selected, the sub-word driver SWD221 for instance, maintains this same status during standby. Generally, at this point, in the sub-word driver SWD during standby, the main word line MWLbp is driven to write voltage VW, the main word line MWLbn is driven to supply voltage VDL, the main word line MWLRtn is driven to standby voltage −VB, also the common word line FXtp is driven to ground potential VSS, the common word line FXtn is driven to standby voltage −VB, and the common word line FXbn is driven to supply voltage VDL so that the transistors Mn1, Mn2 for the sub-word drivers SWD start to conduct (turn on), and the transistors Mp1, Mn3, Mn4 turn off, and the sub-word line SWL is held at standby voltage −VB.

Secondly, the states when the main word line is selected and the common word lines are not selected is explained. When the sub-word driver SWD111 is selected, the sub-word driver SWD121 sets to this status. The operation of the sub-word driver SWD121 is shown in the middle section of FIG. 8.

When the read control signal φr at ground potential VSS is driven to supply voltage level VDL and sets to read status, the main word driver MWD1 drives the main word line MWL1*bn* at supply voltage level VDL to ground potential VSS, and the main word line MWLR1*tn* at standby voltage −VB is driven to supply voltage VDL. The common word driver FXD21 is held at non-select status, and the common word lines FX21*tp*, FX21*tn* and FX21*bn* are held at ground potential VSS, standby voltage −VB and supply voltage VDL. Therefore, the main word line MWL1*bp* is driven to write voltage VW, the main word line MWL1*bn* is driven to standby voltage −VB, and the main word line MWLR1*tn* is driven to supply voltage VDL, also the common word line FX21*tp* is driven to ground potential VSS, the common word line FX21*tn* is driven to standby voltage −VB, the common word line FX21*bn* is driven to supply voltage VDL so that the transistors Mn2, Mn3 for the sub-word driver SWD121 start to conduct (turn on), and the transistors Mp1, Mn1, Mn4 turnoff, the sub-word line SWL121 is held at standby voltage −VB.

Next, when the read control signal φr drops from supply voltage VDL to ground potential VSS reaching write status, the main word driver MWD1 drives the main word line MWL1*bp* from write voltage VW to ground potential VSS, the main word line MWL1*tn* at supply voltage level VDL is driven to standby voltage −VB. The main word line MWL1*bp* is therefore driven to ground potential VSS, the main word line MWL1*bn* is driven to standby voltage −VB and the main word line MWLR1*tn* is driven to ground potential VSS, also the common word line FX21*tp* is driven to ground potential VSS, the common word line FX21*tn* is driven standby voltage −VB and the common word line FX21*bn* is driven to supply voltage level VDL so that the transistor Mn2 for the sub-word driver SWD121 start to conduct (turn on), the transistors Mp1, Mn1, Mn3, Mn4 turnoff, and the sub-word line SWL121 is next held at standby voltage −VB.

Thirdly, the state when the main word line is at non-select status and the common word line is in select status are explained. When the sub-word driver SWD111 is selected, the sub-word driver SWD211 sets to that status. The operation of the sub-word driver SWD121 here is shown in the lower section of FIG. 8.

When the read control signal φr at ground potential VSS is driven to read status at supply voltage level VDL, the main word driver MWD1 is held at non-select status, and the main word lines MWL2bp, MWL2bn and MWLR2n are held at write voltage VW, supply voltage VDL and standby voltage −VB. Also the common word driver FXD11 drives the common word lines FX11tp, FX11tn from ground potential VSS, standby potential −VB, to respectively write voltage VW and supply voltage level VDL. The main word line MWL2bp is therefore driven to write voltage VW, the main word line MWL2bn to supply voltage level VDL, and the main word line MWLR2tn to standby voltage −VB, also the common word line FX11tp is driven to write voltage VW, the common word line FX11tn is driven to supply voltage VDL and the common word line FX11bn is driven to standby voltage −VB so that the transistors Mn1, Mn4 for the sub-word-driver SWD211 start to conduct (turn on), the transistors Mp1, Mn2, Mn3, turn off, and the sub-word line SWL211 is next held at standby voltage −VB. Also, even if the read control signal φr at supply voltage VDL is driven to ground potential VSS, the status of the main word lines MWL2bp, MWL2bn and MWLR2tn, and the status of the common word lines FX11tp, FX11tn and FX11bn are maintained, and the sub-word line SWL211 is maintained at standby voltage −VB by the sub-word driver SWD211.

A case showing the application of voltage to the gate oxidation film of each MOS transistor in sub-word driver SWD111 configured as shown in FIG. 1 is shown based on the above described operation. This example, is described using an NMOS transistor when the supply voltage is set as VDL=1.5 [V], the standby voltage is set as −VB=[−2V], the read voltage is set as VR=0.5 [V], and the write potential is set as VW=3[V].

The second high level of supply voltage VDL is input to the gate of the MOS transistor Mn5 in the sub-word driver SWD11 that was selected so that during the read operation, the voltage applied to the gate and drain of the MOS transistor Mn5 becomes:

VW−VDL=1.5 [V]

Further, current does not flow constantly to the transistor Mn5 since the NMOS transistors Mn1, Mn2 are in the cutoff state, and the source voltage of the transistor Mn5 becomes (VDL−Vthn). Therefore the voltage applied to the gate oxidation film between the gate and source of the transistor Mn5 becomes, VDL−(VDL−Vthn)=0.3 [V]

and during the write operation, the voltage applied to the gate oxidation film between the gate and drain of the NMOS transistors Mn1, Mn2 becomes, (VDL−Vthn)−(−VB)=3.2 [V]

Therefore, by inserting a transistor Mn5 input at the gate with a supply voltage VDL, the drain voltage potential of the transistor Mn1 is pulled down from the write voltage VW to the (VDL−Vthn) so that the voltage applied to the gate oxidation film between the gate and drain of the transistors Mn1, Mn2 is reduced by an amount equal to, VW−(VDL−Vthn)=1.8 [V]

Also, during the write operation, by inputting VDL to the gate of the MOS transistor Mn4 from the common word line FXtn, the same reasoning applies to the voltage applied between the gate and drain as well as between the gate and source of the transistors Mn3 and Mn4, so that the breakdown voltage can be reduced.

On the other hand, in regards to the standby status and non-select status of the sub-word driver, by separating the main word lines MWLbp and MWLbn from the common word lines FXtp and FXnp, the voltage input to the transistors Mn1, Mn2 is reduced by an amount equal to,

VW−VDL=1.5 [V]

and the breakdown voltage can be reduced. In other words, the voltage input to the transistors Mn1, Mn2 is reduced just by the above amount, and the voltage applied between the gate and drain, and between the gate and source is a maximum for the transistors Mn1, Mn2 and Mn5 at

VDL−(−VB)=3.5 [V]

Therefore, in a sub-word driver configured as shown in FIG. 1, the gate oxidation film toxn is set thicker than, (VDL+VB)÷Eox max=3.5 [V]÷4.5 [MV/cm]≈7.8 [nm]

so as not to exceed the maximum electric field of 4.5 [MV/cm]. The gate oxidation film toxn the NMOS transistor in the sub-word driver is set within this range, and the problem of breakdown voltage on the gate oxidation film between the gate and drain of transistors Mn1, Mn2 can in this way be resolved. From these results and from the previously related tox figures, if the sub-word driver and peripheral circuits are differentiated per the gate oxidation film thickness, then high speed circuit operation can be achieved.

On the other hand, making the film thickness of the peripheral circuits match the sub-word driver value allows simplifying the manufacturing process and the number of masks required can be reduced. In some cases, the second high level (here, the supply voltage VDL) of the main word line MWLbn and the voltage level input to the gate of the transistor Mn5 can be set as an appropriate value not exceeding the maximum electric field of 4.5 [MV/cm], and the voltage level input to the gate of the transistor Mn5 may be set as a pulse signal having an appropriate amplitude. However, the high level of the data line DL is preferably set to the same level as the supply voltage VDL so as not to increase the number of supply voltage lines, and lighten the load on the power supply within the chip, in order to keep the drive capability of the transistor Mn5 about the same level as the transistors Mn1 and Mn2.

The case of the PMOS transistor in next explained. By separating the main word lines MWLbp and MWLbn, in the selected sub-word driver SWD111, the voltage input to the gates of the transistors Mp1, Mp2 can be reduced by an amount equal to,

VSS−(−VB)=2 [V]

and the breakdown voltage can be reduced. In other words, the voltage input to the transistors Mp1, Mp2 is reduced by this amount, and the voltage differential between the gate and source and between the gate and drain of PMOS transistors Mp1, Mp2 becomes a maximum during the write operation, and the write voltage VW equals 3 [V]. In standby status and non-select status on the other hand, a fixed input at ground potential VSS is input to the gate of the transistor Mp2 so that the voltage applied to the gate oxidation film between the gate and drain of the transistor Mp2 becomes, $$VSS-(-VB)=2\ [V]$$

Also, current does not flow to the transistor Mp2 since the transistor Mp1 is turned off, and the source voltage of the transistor Mp2 becomes, $$VSS+|Vthp|=0.3\ [V]$$

so that the voltage differential between the gate and source of transistor Mp2 becomes, $$(VSS+|Vthp|)-VSS=0.3\ [V]$$

The voltage applied to the gate oxidation film between the source and drain of PMOS transistor Mp1 therefore becomes, $$VW-|Vthp|=2.7\ [V]$$

Therefore, by inserting transistor Mp2 input at the gate with ground potential VSS, the drain voltage potential of transistor Mp1 is pulled down from write voltage −VB to threshold voltage |Vthp| so that the breakdown voltage can be reduced. In other words, the voltage applied to the gate oxidation film between the gate and drain is reduced by an amount equal to, $$(VW+VB)-(VW-|Vthp|)=2.3\ [V]$$

Therefore, in a sub-word driver configured as shown in FIG. 1, the gate oxidation film toxp of the PMOS transistor is set thicker than, $$VW \div Eox\ max = 3\ [V] \div 4.5\ [MV/cm] \approx 6.7\ [nm]$$

so as not to exceed the maximum electric field of 4.5 [MV/cm]. The problem of breakdown voltage on the gate oxidation film between the gate and drain of transistors Mp1, Mp2 can in this way be resolved. From these results and from the tox figures related previously, if the sub-word driver and peripheral circuits are differentiated per the gate oxidation film thickness, then high speed circuit operation can be achieved.

On the other hand, making the film thickness of the peripheral circuits match the sub-word driver value allows simplifying the manufacturing process and the number of masks required can be reduced. In some cases, the first low level (here, the ground potential VSS) of the main word line MWLbp and the voltage level input to the gate of the transistor Mn5 can be set as an appropriate value not exceeding the maximum electric field of 4.5 [MV/cm], and the voltage level input to the gate of the transistor Mn5 may be set as a pulse signal having an appropriate amplitude. However, the low level of the data line DL is preferably set to the same level as ground potential VSS so as not to increase the number of supply voltage lines, and lighten the load on the power supply within the chip, in order to keep the drive capability of the transistor Mp2 about the same level as the transistors Mp2.

Also, when the gate electrode material of the transistors Mp1, Mp2 is combined by the method using n+si, the voltage applied to the gate oxidation film between the gate and drain of the transistor Mp2 can be reduced approximately one volt, equivalent to the work function differential ΔW with the drain electrode of p+Si, and the gate oxidation film can thus be made even thinner.

The features related above for the sub-word driver shown in FIG. 1 are now summarized.

(1) In this circuit structure, a select or non-select signal can be issued for a voltage level corresponding to the memory cell read or write operation by utilizing a decode signal in the hierarchical word line structure of the related art. In other words, by inserting an NMOS transistor Mn3, Mn4, the selected sub-word line can be driven to the read voltage VR during the read operation and to the write voltage VW during the write operation. Also, when maintaining standby status or non-select status, the applicable sub-word line can be held at the standby voltage −VB.

(2) Also in this circuit structure, the electric field applied to the gate oxidation film of the MOS transistor can be reduced, regardless of the select or non-select state. In other words, by inserting an oxide-stress relaxation PMOS transistor Mp2 and NMOS transistor Mn5, the problem of breakdown voltage in the gate oxidation film between the gate and drain in PMOS transistor Mp1 and NMOS transistors Mn1, Mn2 can be eliminated.

(3) By isolating the main word line MWL signal in MWLbp and MWLbn of different voltage amplitudes, and by isolating the main word line FX signal in FXtp and FXtn of different voltage amplitudes, the problem of breakdown voltage in the gate oxidation film between the gate and source of the MP1 transistor in the selected sub-word driver can be resolved, and the problem of breakdown voltage in the gate oxidation film between the gate and source of the Mn1, Mn2 transistors in the non-selected sub-word driver can also be resolved. Also, the problem of breakdown voltage in the gate oxidation film between the gate and drain of the Mn3 transistors in the non-selected sub-word driver can also be resolved.

(4) Further, the problem of breakdown voltage in the gate oxidation film between the gate and drain of the MP1 transistor in the selected sub-word driver can be resolved by applying the method of raising the threshold voltage with n+Si material having a work function approximately 1 volt lower than the p+Si gate electrode material of transistor Mp1. Accordingly, along with resolving the breakdown voltage problem, the sub-word driver driving the sub-word line to three voltage values can be comprised of seven MOS transistors.

The main word driver MWD and the common word driver FXD for respectively driving the main word lines MWLbp, MWLbn and MWLRtn and the common word lines FXtp, FXtn and FXbn connected to the sub-word driver shown in FIG. 1 are explained next.

<Main Word Driver>

A typical circuit structure of a main word driver is shown in FIG. 9. The voltage amplitude of the main word line from −VB to VW must be larger than the voltage amplitude of the peripheral circuits which is from VSS to VDL, so by utilizing the sub-word driver shown in FIG. 1, the voltage amplitude of the peripheral circuits is level shifted per the main word driver. Also, the problem of breakdown voltage on the gate oxide film between the gate and drain as well as the gate and source of the sub-word driver transistors Mp1, Mn1 and Mn2 is resolved, and the three types of main word lines MWLbp, MWLbn and MWLRtn are utilized to generate the voltage level select signal for the memory cell read and write operation. The main word driver MWD is therefore comprised of the level shift circuits LSCH, LSCL1 and LSCL2 and the read/write control circuit RWCC1 for independently driving the main word lines MWLbp, MWLbn and MWLRtn.

The read/write control circuit RWCC1 is first explained. The decode signal axj is input to a first input terminal of a NOR circuit NR1 by way of the inverter circuit NV1, and the read/write control signal φr input to the second input terminal of NR1. The decode signal axj is also input to the first input terminal of the NAND circuit ND1, and the read/write control signal φr input to the second input terminal of ND1. The output of NR1 is set as the decode signal axjr11 and the output of ND1 is the decode signal axjr12.

Next, the first level shift circuit LSCH is explained. This circuit takes an input signal having a voltage amplitude from ground potential VSS to supply voltage VDL and outputs it as an output signal having a voltage amplitude with a higher level (here, write voltage VW) than ground potential VSS to supply voltage VDL. The decode signal axjr11 is input to the gate of the NMOS transistor Mn1 and the source of the NMOS transistor Mn2, and the source of the transistor Mn1 is grounded. The drain of transistor Mn1 and PMOS transistor Mp1 as well as the gate of Mp2 are grounded to the first main word line MWLbp. The write voltage VW is input to the source of the transistors Mp1, Mp2, and the drain of transistors Mn2, Mp2 are connected to the gate of the transistor Mp1 and a feedback circuit formed. Here, by inputting supply voltage VDL to the gate of transistor Mn2, the when the output of the main word line MWLbp reaches ground potential VSS, the DC current flow by way of the transistor Mp2 is cutoff.

Further, the level shift circuit LSCL1 is shown from among the second level shift circuits LSCL1 and LSCL2. The level shift circuits LSCL1 and LSCL2 have the same circuit structure and level shift an input signal having a voltage amplitude from ground potential VSS to supply voltage VDL, and output it as a signal having a voltage amplitude of a level (here, standby voltage −VB) lower than ground potential VSS to supply voltage VDL.

A decode signal axj is input to the gate of PMOS transistor Mp1 and the source of PMOS transistor Mp2, and supply voltage VDL input to the source of the transistor Mp1. The drain of transistor Mp1 and NMOS transistor Mn1 as well as the gate of Mn2 are connected to the second main word line MWLbn. Also, the source of transistors Mn1, Mn2 are connected to standby voltage −VB, and the drains of transistor Mp2, Mn2 are connected to the gate of the transistor Mn1 to form a feedback circuit. Here, by inputting a ground potential VSS (level) to the gate of transistor Mp2, the DC current flow by way of transistor Mn2 is shut off when the output of the main word line MWLbn reaches the supply voltage VDL level.

<Main Word Driver Operation>

The operation of the main word driver MWD utilizing the above structure is explained. The main word driver MWD is selected by the decode signal axj reaching the supply voltage level VDD. Then, the three types of main word lines MWLbp, MWLbn, and MWLtn are driven to a voltage level according to the memory cell read/write operation.

In other words, when the read/write control signal φr at ground potential VSS, is driven to supply voltage level VDL during read operation, the decode signal axjr11 at ground potential VSS is input to the level shift circuit LSCH, the transistor Mp1 conducts and the main word line MWLbp is held at write voltage VW. A decode signal axj at supply voltage VDL is input to the level shift circuit LSCL1, and the transistor Mn1 conducts and the main word line at supply voltage VDL is driven to standby voltage −VB. A decode signal axjr12 at ground potential VSS is input to the level shift circuit LSCL2, the transistor Mp1 conducts, and the main word line MWLRtn at standby voltage −VB, is driven to supply voltage level VDL.

On the other hand, when the read/write control signal φr at supply voltage level VDL is driven to ground potential VSS during write operation, the decode signal axjr11 at supply voltage level VDL is input to the level shift circuit LSCH, the transistor Mn1 conducts and the main word line MWLbp at write voltage VW is driven to ground potential VSS. The decode signal axj is still at supply voltage level VDL so that for level shift circuit LSCL1, the transistor Mn1 conducts and holds the main word line MWLbn at standby voltage −VB. Further, the decode signal axjr12 at supply voltage level VDL is input to the level shift circuit LSCL2, the transistor Mn1 conducts, and the main word line MWL-Rtn at supply voltage VDL is driven to standby voltage −VB.

The voltages applied to the gate oxidation film of each transistor in the main word driver used for performing such operations are described next. The voltage applied to the gate oxidation film between the gate and source and between the gate and drain of the transistor Mp1 for the level shift circuit LSCH, becomes VW at maximum in standby operation and in select main word driver read operation. Also, the voltage applied to the gate oxidation film between the gate and source of transistor Mp2, is a maximum in the write operation of the selected main word driver. Further, the voltage applied to the gate oxidation film between the gate and drain of transistor Mp2 is a maximum in standby status and read operation of the selected word driver, and is VW in either case. Therefore, the breakdown voltage problem can be avoided if a gate oxidation film thickness and a gate electrode material the same as the PMOS transistor in the sub-word driver shown in FIG. 1 is utilized. On the other hand, a voltage applied to the gate oxidation film between the gate and source, and between the gate and drain of transistor Mn1 for the level shift circuits LSCL1, LSCL2, is a maximum in the read operation of the selected sub-word driver, and becomes (VDL+VB). The voltage applied to the gate oxidation film between the gate and source of transistor Mn2 is a maximum in the read operation of the selected main word driver, the voltage applied to the gate oxidation film between the gate and drain of transistor Mn2 is a maximum in the write operation of the selected word driver and is also (VDL+VB) Therefore, the breakdown voltage problem can be avoided if the same gate oxidation film thickness as the NMOS transistors in the sub-word driver shown in FIG. 1.

<Common Sub-Word Driver>

The common sub-word driver FXD is shown in FIG. 10. The voltage amplitude of the common key word line is from −VB to WV and larger than the voltage amplitude from VSS to VDL of the peripheral circuits, so that the voltage amplitude of the peripheral circuit is shifted to the amplitude level of the common word driver by using the sub-word driver shown in FIG. 1. Also the problem of breakdown voltage in gate oxidation film between the gate and source and between the gate and drain of transistor Mp1, Mn2 and Mn4 of the sub-word driver, and the three types of common word lines FXtp, FXtn and FXbn are utilized to generate a select signal for a voltage level corresponding to the read operation of the memory cell.

The common word line FXbn uses the inverted signal of the common word line FXtn so that the common word driver FXD to independently drive the common word lines FXtp, FXtn is comprised of the level shift circuits LSCH, LSCL and the inverter circuits NVL, NV1. The level shift circuits LSCH, LSCL have the same structure as that related for the main word drivers, so the decode signal axj is input to the level shift circuits LSCH, and the decode signal ajb generated by way of the inverter circuit NV1 from the decode signal aj, is input to the level shift circuit LSCL. The output of the level shift circuit LSCH is for the common word line FXtp, and the output of the level shift circuit LSCL is for the common word line FXbn. The inverter circuit NVL is comprised of PMOS transistor Mp1 and NMOS transistor Mn1 but differs from the inverter of the peripheral circuit in that a standby voltage −VB is input to the source of the NMOS transistor Mn. The common word line FXbn is connected to the gates of the transistors Mp1 and Mn1, and the drains are connected to the common word line FXtn.

<Common Word Driver Operation>

The operation of the common word driver FXD utilized in the above structure is described next. The common word driver FXD is selected by the decode signal aj setting to ground potential VSS, the transistor Mp1 of the level shift circuit LSCH conducts and the common word line FXtp at ground potential VSS is driven to write voltage VW. Also, the decode signal ajb at supply voltage VDL is input to the level shift circuit LSCL, the transistor Mn1 conducts, and the common word line FXbn that reached supply voltage level VDD is driven to standby voltage −VB. The transistor Mp1 for the inverter NVL starts conducts by the common word line FXbn at standby voltage −VB, and the common word line FXtn at standby voltage −VB is driven to supply voltage VDL.

In the common word driver performing this kind of operation, the voltage amplitude of the input/output signal is the same as the above described main word driver, so that the voltage applied to the gate oxidation film of each transistor is also equivalent to the main word driver. Accordingly, if a common word driver utilizes transistors having the same gate oxidation film thickness as the PMOS transistor and NMOS transistor in the above mentioned sub-word driver, then the breakdown voltage problem can be resolved.

<Memory Cell Arrays>

Figure 5:
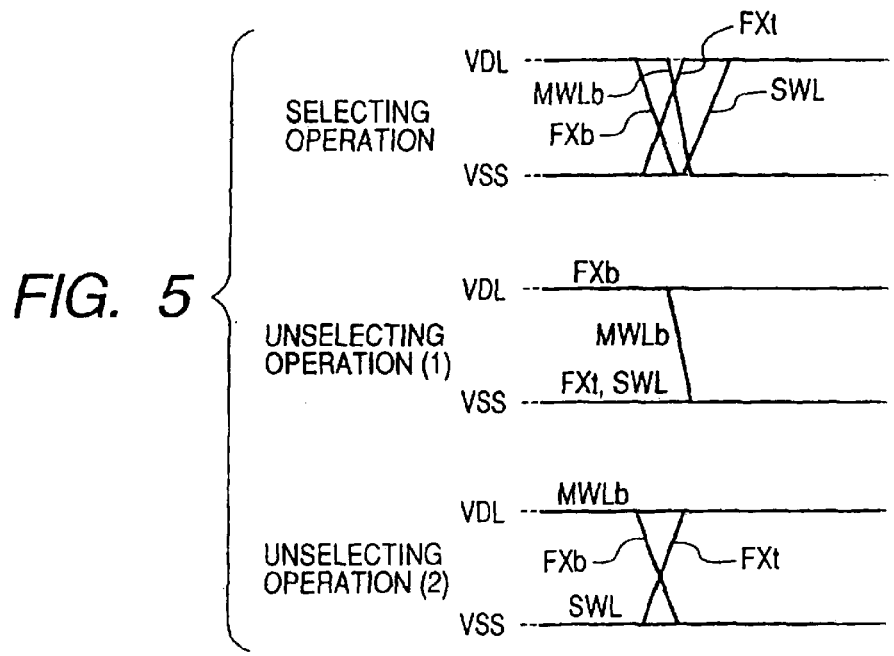
FIG. 5 is a drawing showing the operation timing of the sub-word driver of the related art.

A memory cell array MCA1 utilizing the capacitive coupling 2-transistor cell of FIG. 5 is shown in FIG. 11. The voltage settings are the typical preferred voltage settings in a capacitive coupling 2-transistor cell DRAM shown in FIG. 6. For the purposes of simplicity, four memory cells MC are used for the two bits lines BL1, BL2 and the two sense lines SL1, SL2, and the two sub-word lines SWL111, SWL121, however, a plurality of bit lines BL, sense lines SL and sub-word lines SWL are respectively formed, and a plurality of memory cells MC are formed at desired cross points with these various lines.

An example of memory cells MC formed at cross points with these bit lines BL, sense lines SL and sub-word lines SWL is shown in FIG. 11. A specified circuit configuration such as having witches to control the operation timing of read and write circuits formed with bit lines, and sense lines, as well as charging circuits, and switches for input/output is omitted. The same circuits of the related art are sufficient.

The operation of the memory cell is shown in FIG. 12. First of all, when a write voltage VW with a pulse voltage higher than the threshold voltage VTW of the transistor QW is applied to the selected sub-word line SWL, the transistor QW conducts (turns on), and the voltage potential of the bit line according to the write data, is applied to the memory cell node N, and writing operation begins. This voltage potential is provided by way of a sequence selected write circuit applied with an external voltage, and for instance, is voltage supply level VDL when storing the information "1", and is ground potential VSS when storing the information "0". Next, the sub-word line SWL sets to standby voltage −VB. At this time, the voltage VN(H) of the memory cell node applied with supply voltage VDL, becomes lower than the threshold voltage VTR of transistor QR due to the coupling capacitor Cc so that the transistor QR, QW are cut-off and the information is held. Further, when a pulse voltage of read voltage VR is applied to the selected word line after the sense line is precharged to the supply voltage level VDL, a signal voltage corresponding to the information held in memory node N is read out at the sense line.

When for instance, information "1" is stored, the voltage of memory cell node at VN(H) is a VN' (H) higher than the threshold voltage VTR of transistor QR due to the coupling capacitor Cc, so the transistor QR conducts (turns on), and the sensor line SL precharged to supply voltage VDL is discharged to ground potential VSS. On the other hand, when the information "0" has been stored, the voltage of a memory cell node at VN(L) becomes VN' (L) lower than the threshold voltage VTR of transistor QR due to coupling capacitor Cc so that the transistor QR is held in cutoff state, and the precharged sense line SL is held at supply voltage level VDL. As a result, the desired voltage is extracted externally, from the signal read from the sense line SL by way of the sequence selected read circuit, and sets to read operation.

In the above description, the capacitive coupling 2-transistor cell shown in FIG. 5, was used in the hierarchical word structure shown in FIG. 7 and explained by focusing mainly on the each circuit of the sub word driver. Further, the driving of the selected word line to three voltage values was shown while adequately reducing the voltage applied to the gate oxide film of each MOS transistor.

Among these, an example was shown for driving the main word line MWL by the read control signal φr in FIG. 9, however the main word line MWL may also be driven by a read control circuit utilizing the decode signal axj and the write control signal φwb in FIG. 12. Further, in the capacitive coupling 2-transistor cell shown in FIG. 5, the transistor QW utilized the tunnel effect however NMOS transistor operation is used so a normal NMOS transistor may be utilized at transistor QW.

In the three-transistor cell typified as shown in FIG. 4, when using the hierarchical word line structure shown in FIG. 7 with the memory cell controlling read operation of the three value word line voltage, the methods in FIG. 1, FIG. 9 and in FIG. 10 can be applied in order to drive the selected sub-word line to the three voltage values while adequately reducing the voltage applied to the gate oxidation film of each MOS transistor in the circuit. Another structure of the sub-word driver is explained next.

<Second Embodiment>

Figure 13:
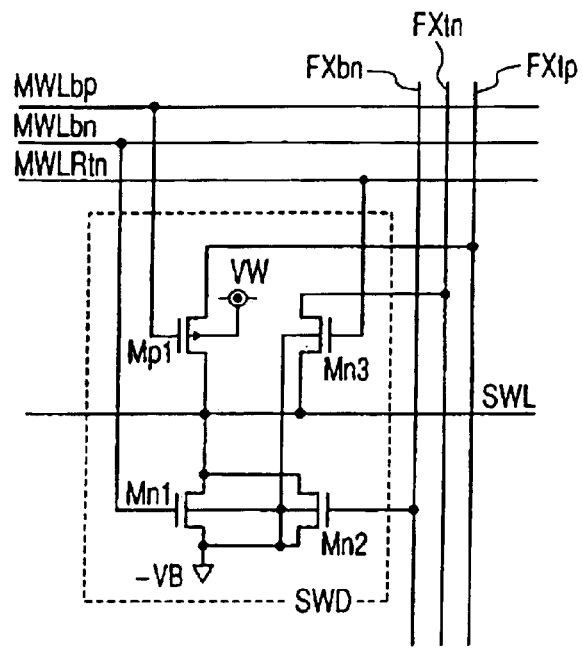
FIG. 13 is a circuit diagram of the sub-word driver for generating the three value voltage levels of the second embodiment.

A typical circuit structure of a sub-word driver not having the oxide-stress relaxation transistor is shown in FIG. 13.

Compared to the circuit structure of the sub-word driver shown in FIG. 1, in the sub-word driver 61 of FIG. 13 the PMOS transistor Mp2 and the NMOS transistor Mn5 have been removed. Other points of difference are that the NMOS transistor Mn4 for selecting the read voltage has been eliminated and the NMOS transistor Mn3 is jointly used, also the source of transistor Mn3 is connected to the common word line FXtn. Accordingly, main features are that the sub-word driver for driving the selected sub-word line to three voltage values, can be comprised of four MOS transistors and that increases in the surface area of the circuit can be restricted.

In this kind of circuit structure, the gate oxidation film thickness of the MOS transistors comprising the sub-word driver can be made sufficiently thick, and the electric field in the gate oxidation film between the gate and source, and the gate and drain of the MOS transistors can be prevented from exceeding the maximum electric field Eox max. Also, the preferred voltage settings in the capacitive coupling 2-transistor DRAM cell shown in FIG. 6, can also be applied so the sub-word line voltage amplitude is near the supply voltage level VDL amplitude, and to prevent the electric field in the gate oxidation film between the gate and source, and the gate and drain of the MOS transistors from exceeding the maximum electric field Eox max.

The circuit structure shown in FIG. 9 is utilized in the main word driver MWD for driving the main word lines MWLbp, MWLbn, and MWLRtn connected to the sub-word driver shown in FIG. 13.

Figure 14:
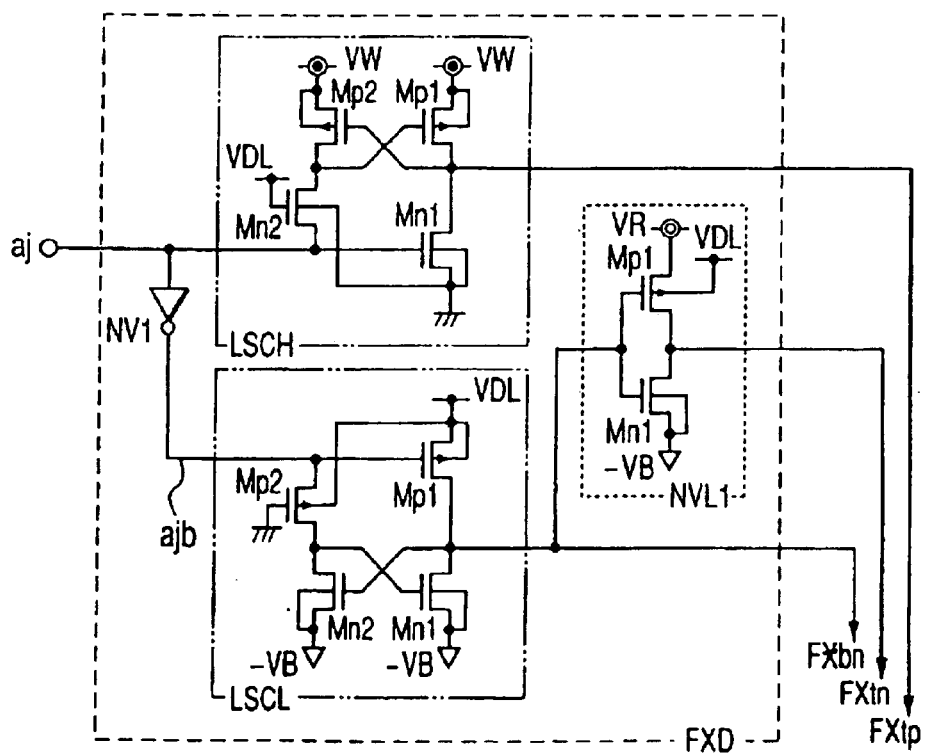
FIG. 14 is a circuit diagram for the common word driver of the second embodiment.

On the other hand, the common main word driver FXD connected respectively to the common word lines FXtp, FXtn, and FXbn is shown in FIG. 14. The points of difference compared to the common word driver FXD shown in FIG. 10 is that a read voltage VR is input to the source of the PMOS transistor Mp1 in the inverter circuit NVL1 for driving the common word line FXtn. The voltage amplitude of the common word line FXtn signal therefore changes from standby voltage −VB to the read voltage VR.

Figure 15:
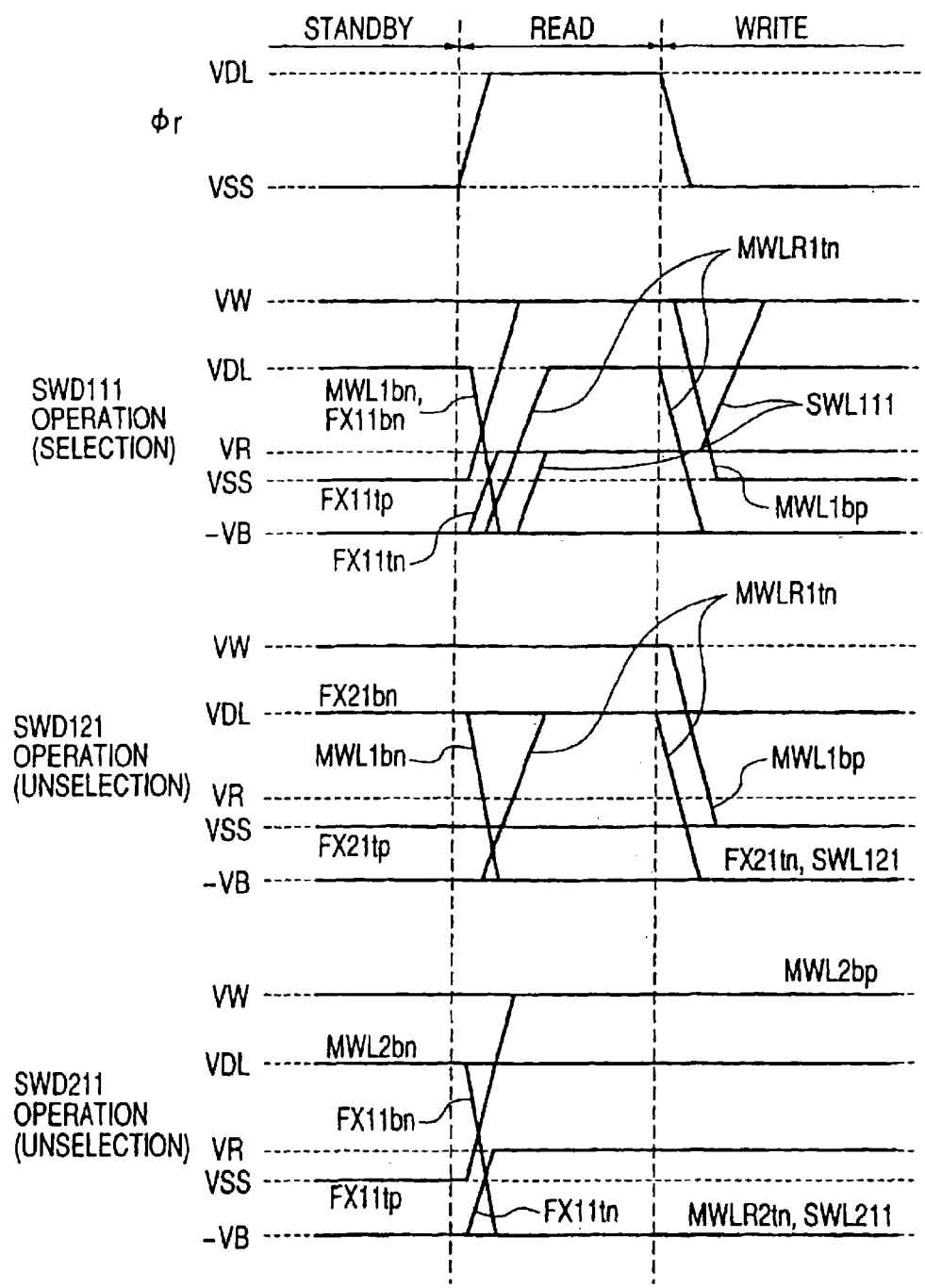
FIG. 15 is operation timing diagrams of the sub-word driver for generating the three value voltage levels of the second embodiment.

The operation of the sub-word driver of FIG. 13 is shown in FIG. 15. The operation timing for the sub-word driver that generates the three value voltage levels is shown in the drawings in FIG. 15, and shows an operation timing the same as in FIG. 8. Compared to the operation shown in FIG. 8, for the sub-word driver of FIG. 1, the point of difference here is the operation when the common word line FXtn is selected.

The case when the main word line and the common word line are both selected is explained. The selected main word driver MWD1 drives the main word line MWLRtn1 from standby voltage −VB in read operation, to the supply voltage VDL. Also, the common word driver, drives the common word line FX11tn from standby voltage −VB to read voltage VR. Therefore, the transistor Mn3 conducts, the sub-word line SWL111 is selected, and the sub-word line SWL111 at standby voltage −VB, is driven to read voltage VR.

The case when the main word line is not selected, and the common word line is selected is explained next. When the sub-word line SWL111 is selected, the sub-word line SWL211 for instance, sets to this state. The main word driver MWD2 is held in non-select status, and the main word lines MWL2bn, MWLR2tn are respectively held at supply voltage VDL and standby voltage −VB. The common word driver on the other hand, drives the common word line FX11tn from standby voltage −VB to read voltage VR. The transistor Mn3 is therefore cutoff, the transistor Mn1 conducts, and the sub-word line SWL211 is set to non-select status at standby voltage −VB.

The circuit structure in FIG. 13, showed a configuration where the main word line MWLRtn is connected to the gate of transistor Mn3, and the common word line FXtn is connected to the source of the transistor Mn3. However, a circuit structure having the common word line FXtn connected to the gate of transistor Mn3, and the main word line MWLRtn connected to the source of transistor Mn3 may also be used. In this case, a structure is utilized for the main word driver shown in FIG. 9, where a read voltage VR is input to the source of transistor Mp1 in the level shift circuit LSCL2 and the signal amplitude of the main word line MWLRtn is shifted from standby voltage −VB to the read voltage VR. Further, for the circuit structure of the common word driver shown in FIG. 10, the signal amplitude of the common word line FXtn is shifted from standby voltage −VB to supply voltage VDL.

<Third Embodiment>

Figure 16:
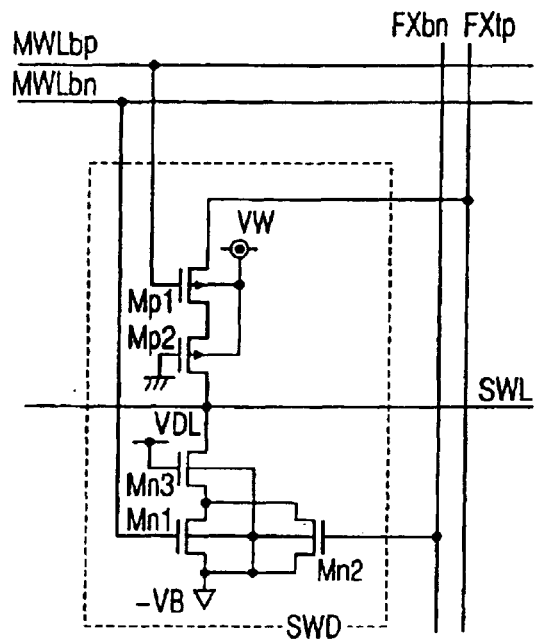
FIG. 16 shows operation timing diagrams of the sub-word driver for generating the three value voltage levels of the third embodiment.

Still another embodiment of the sub-word driver is shown in FIG. 16.

Unlike the sub-word driver shown in FIG. 1, this circuit is characterized by a simpler circuit structure since the NMOS transistors Mn3, Mn4 and main word line MWLR5n as well as common word line FXtn are eliminated. This kind of circuit structure is also characterized in that the voltage potential on the common word line FXtp connected to the source of PMOS transistor Mp1 is controlled according to the read or write operation.

Figure 17:
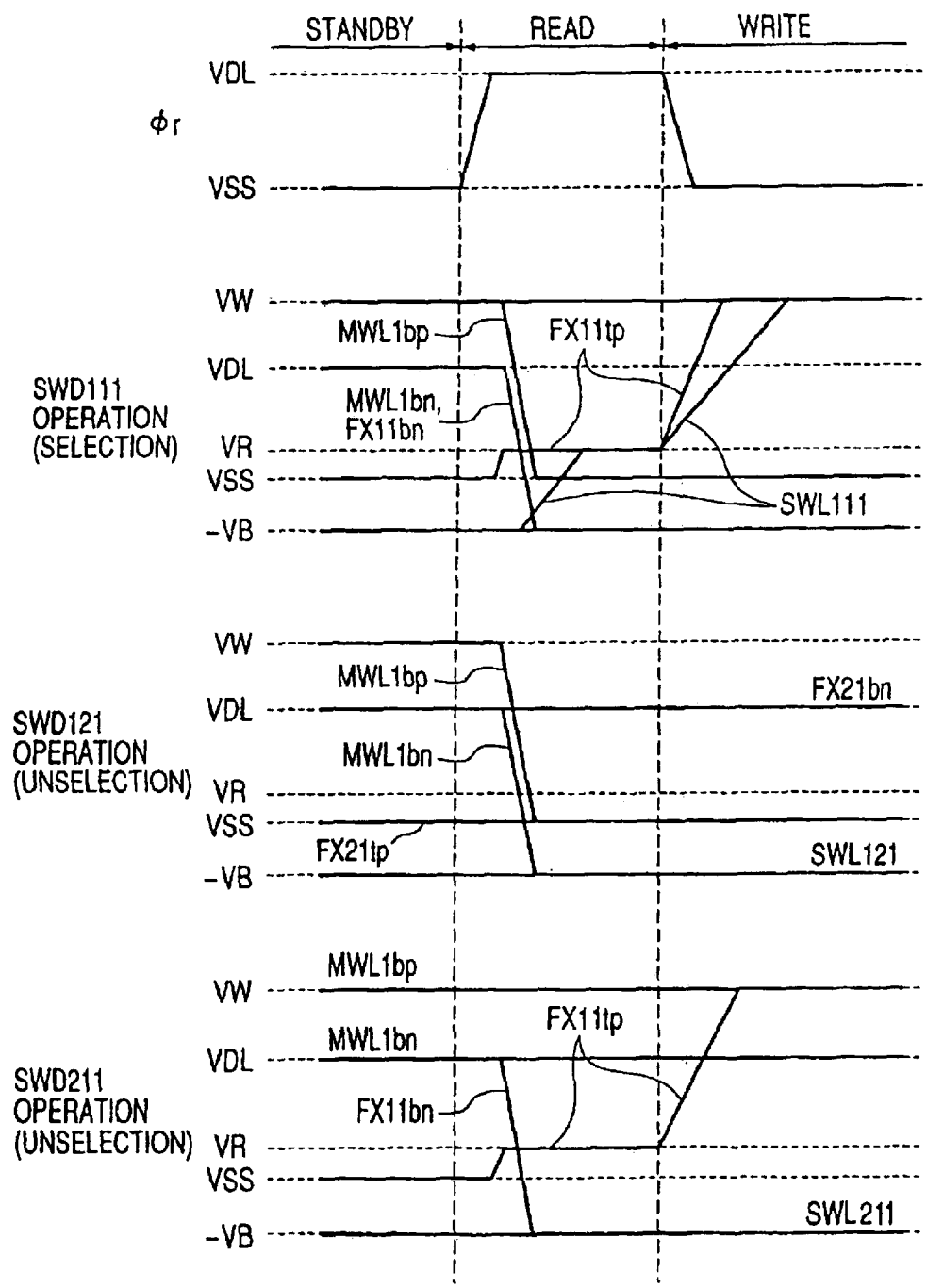
FIG. 17 shows operation timing diagrams of the sub-word driver for generating the three value voltage levels of the third embodiment.

The operation of the sub-word driver SWD of FIG. 16 is explained according to FIG. 17. This figure shows the case when the sub-word line SWL111 is selected, and the state is consecutively changed from standby state to read operation. The main word driver MWD1 drives the main word line MWL1bp from write voltage VW to ground potential VSS, and the main word line MWL1bn is driven from supply voltage VDL to standby voltage −VB. In this state, first of all, when the read control signal φr at ground potential VSS is driven to read status at supply voltage VDL, the common word driver FXD11 drives the common word lines FX11tp, FX11bn respectively from ground potential VSS and supply voltage VDL, to read voltage VR and standby voltage −VB. Therefore, the main word lines MWL1bp, MWL1bn are respectively driven to ground potential VSS and standby voltage −VB, and the common word lines FX11tp, FX11bn are respectively driven to read voltage VR and standby voltage −VB, so that the transistor Mp1 conducts, the sub-word driver SWD111 is selected, and the sub-word line SWL111 at standby voltage −VB is driven to read voltage VR.

Next, when the read control signal φr at supply voltage VDL is driven to ground potential VSS and write status, the common sub-word driver FXD11 drives the common word line FX11tp from read voltage VR to write voltage VW. The main word lines MWL1bp, MWL1bn therefore remain driven respectively to ground potential VSS and standby voltage −VB and are held there. The common word lines FX11tp, FX11bn are respectively driven to the write voltage VW and standby voltage −VB, so that the transistor Mp1 conducts, the sub-word driver SWD111 is selected, and the sub-word line SWL111 at read voltage VR is driven to the write voltage VW.

The main word drivers MWD respectively driving the main word lines MWLbp, MWLbn connecting to the sub-word driver shown in FIG. 16, and the common word driver FXD driving the common word lines FXtp, FXtn are explained below.

Figure 18:
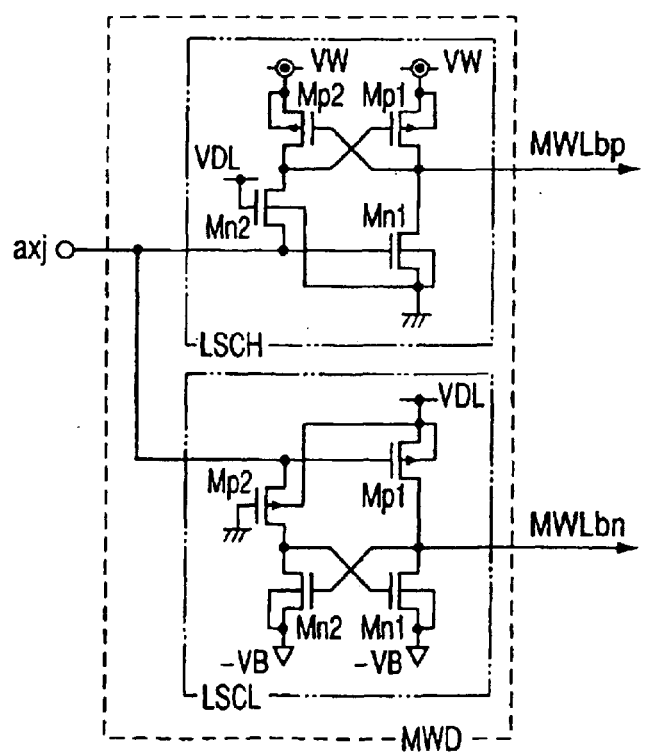
FIG. 18 is a circuit diagram of the main word driver of the third embodiment.

First of all, the main word driver MWD in FIG. 18 is described. As explained previously in the operation shown in FIG. 17, a read control circuit is not required in the main word driver in order to execute control according to read and write operation in the common word driver of the third embodiment. The main word driver MWD is therefore comprised of level shift circuits LSCH, LSCL to independently drive the main word lines MWLbp, MWLbn. In other words, the decode signal axj is input to the level shift circuits LSCH, LSCL, and their respective outputs used for the main word lines MWLbp, MWLbn. The decode signal axj is selected on being driven to supply voltage level VDL, and the main word line MWLbn is driven from write voltage VW to ground potential VSS, and the main word lines MWLbp is driven from supply voltage VDL to standby voltage −VB.

Figure 19:
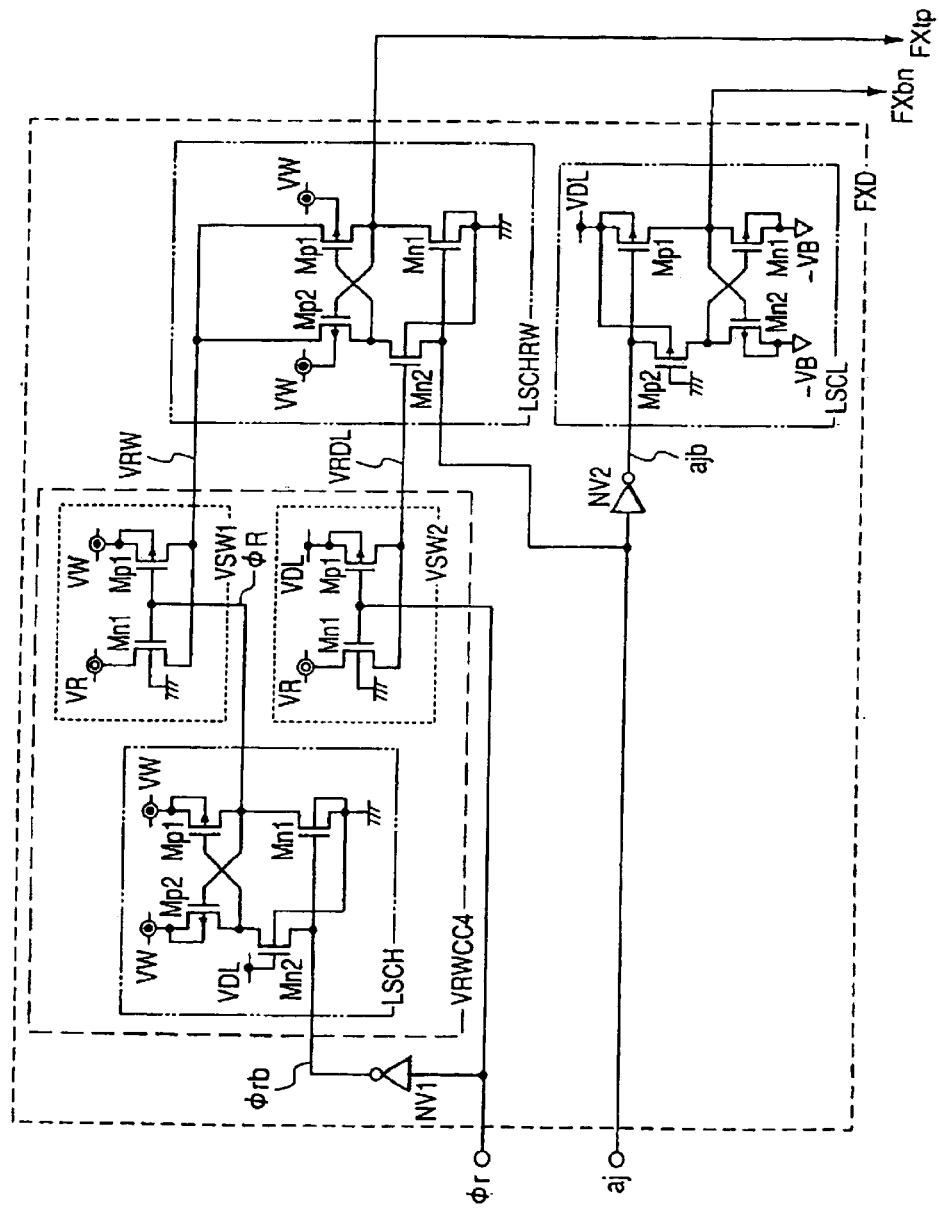
FIG. 19 is a circuit diagram of the common word driver of the third embodiment.

The common word driver FXD of FIG. 19 is described. The common word driver FXD is comprised of the level shift circuits LSCHRW, LSCL to independently drive the common word lines FXtp, FXbn, and the inverter circuits NV1, NV2. The read/write control circuit VRWCC is comprised of the level shift circuit LSCH described in the first embodiment and the voltage switcher circuits VSW1, VSW2. An inverted signal ajb received by way of the inverter circuit NV1 from the decode signal aj, is input to the level shift circuit LSCH, and the output of the level shift circuit LSCH used as the read control signal ΦR. Therefore, the read control signal φr with an amplitude from ground potential VSS to supply voltage VDL, becomes the read control signal ΦR, with a voltage amplitude from ground potential VSS to write voltage VW. The voltage switcher circuit VSW1 is comprised of PMOS transistor Mp1 and NMOS transistor Mn1. The read control signal ΦR is connected to the gate of the transistors Mp1 and Mn1, and a write voltage VW is input to the source of transistor Mp1, and a read voltage VR is input to the source of the transistor Mn1. A read/write voltage VRW is applied to the drains of transistors Mp1 and Mn1.

The voltage switcher circuit VSW2 is comprised of PMOS transistor Mp1 and NMOS transistor Mn1. The read control signal φr is connected to the gates of the transistors Mp1 and Mn1, a supply voltage VDL is input to the source of transistor Mp1, and a read voltage VR is input to the source of the transistor Mn1. A cutoff voltage VRDL is applied to the drain of the transistors Mp1 and Mn1. The level shift circuit LSCHRW is different from the level shift circuit LSCH described in the first embodiment, in the point that a read/write voltage VRW is input to the source of the PMOS transistors Mp1, Mp2, and that a cutoff voltage VRDL is input to the NMOS transistor Mn2. In the level shift circuit LSCHRW of this kind of structure, a decode signal aj is connected to the source of transistor Mn2 and the gate of transistor Mn1, and the drains of transistor Mn1 and Mp1 as well as the gate of transistor Mp2 are used for the common word line FXtp. An inverted signal ajb received by way of the inverter circuit NV2 from the decode signal, is input to the level shift circuit LSCL and that output used for the common word line FXbn.

In the common word driver FXD configured as described above, the decode signal aj is selected by reaching ground potential VSS. First of all, when the read control signal φr at ground potential VSS is driven to read status at supply voltage VDL, this signal is input to the voltage switcher circuit VSW2 so that the transistor Mn1 conducts, and the cutoff voltage VRDL at supply voltage VDL is driven to the read voltage VR. Also, the read control signal ΦR is set to write voltage VW so that the read/write voltage VRW is from write voltage VW to read voltage VR. Accordingly, in the level shift circuit LSCHRW, a ground potential VSS decode signal aj, a read/write voltage VRW of read voltage VR and a cutoff voltage VRDL are input so that the transistors Mn1, Mp2 reach a cutoff state, the transistors Mn2, Mp1 conduct, and the common word line FXtp is driven from ground potential VSS to read voltage VR. Also, a supply voltage VDL is input in the level shift circuit LSCL, so that the common word line FXbn is driven from is driven from supply voltage VDL to standby voltage −VB. Next, when the read control signal φr at supply voltage VDL is driven to ground potential VSS reaching write operation, this signal is input to the voltage switcher circuit VSW2 so that the transistor Mp1 conducts, and the cutoff voltage VRDL is driven from read voltage VR to the supply voltage VDL. Also, the read control signal ΦR changes from write voltage VW to ground potential VSS so that the read/write voltage VRW is driven from read voltage VR to write voltage VW. Therefore, in the level shift circuit LSCHRW, a ground potential VSS decode signal aj, a read/write voltage VRW of the write voltage VW and a cutoff voltage VRDL are input so that the transistors Mn1, Mp2 reach a cutoff state, the transistors Mn2, Mp1 conduct, and the common word line FXtp is driven from read voltage VR to write voltage VW. Also an inverted decode signal ajb of supply voltage VDL is input in the level shift circuit LSCL, and the common word line FXbn is held at standby voltage −VB.

The operation of the level shift circuit LSCHRW on the other hand, in non-select state is different from the level shift circuit LSCH, in order to switch the write voltage VRW. In other words, in the non-select state, the decode signal aj of supply voltage VDL is input, and transistor Mn1 conducts, and the common word line FXtp is driven to ground potential VSS. Here, in the write operation and in the standby state, the read/write voltage of write voltage VW as well as the cutoff voltage VRDL of the supply voltage VDL are input so that the transistor Mp2 conducts, and the transistor Mp2 reaches the cutoff state. Then, a read/write voltage VRW of write voltage VW is input to the drain of the transistor Mn2 so that the transistor Mn2 reaches the cutoff state, and the DC current by way of the transistor Mp2 is cutoff. Further, the read/write voltage VRW of read voltage VR as well as the cutoff voltage VRDL, are input in the read operation so that the transistor Mp2 conducts, and the transistor Mp1 reaches the cutoff state. Then, the read/write voltage VRW of read voltage VR is input to the drain of the transistor Mn2 so that the transistor Mn2 reaches cutoff state, and the DC current is cutoff by way of the transistor Mp2.

As previously explained, the common word driver of this embodiment shown in FIG. 19, is characterized in driving the common word line to three voltage levels. More specifically, a read/write control circuit VRWCC4 controls the voltage according to the read/write operation. This word driver is further characterized by switching to a cutoff voltage VRDL according to the voltage selection, in order to prevent DC current from flowing in the level shift circuit LSCHRW.

In the preferred voltage settings for the capacitive coupling 2-transistor DRAM shown in FIG. 6, the threshold voltage of transistor Mn2 is sufficiently larger than the read voltage VR so that when the drive performance of transistor Mn2 is sufficiently large, a fixed cutoff voltage VRDL may be used in the read voltage VR. Further, in the voltage switcher circuit VSW1, the read/write voltage VRW is driven by two different positive voltages by way of the transistors Mp1 and transistor Mn1 having different well structures, so that the occurrence of a latchup is prevented when the power is turned on, and a write voltage VW definitely higher than the supply voltage VDL can be generated.

A summary of the sub-word driver shown in FIG. 16 is next explained. By utilizing the common word driver FXD shown in FIG. 19, the sub-word driver shown in FIG. 16 for outputting three voltage values can be comprised by five MOS transistors. Also the circuit structure of this portion is simple since it is comprised by two main word lines and two common word lines, and the surface area can therefore be kept small. By utilizing the circuit shown in this embodiment with the preferred voltage settings for the capacitive coupling 2-transistor DRAM shown in FIG. 6, the breakdown voltage problem in the gate oxidation film can be resolved, as is easily understood from the description of the first embodiment. Alternatively, the method utilizing n+si gates in the PMOS transistors Mp1, Mp2 described in the first embodiment, or the method for suitably amplifying the level-shifted main word line signal and common word line signal, can also be applied to the circuits shown in this embodiment. Also, the application of a fixed level voltage to the gates of the oxide-stress relaxation transistors Mp2, Mn5, is not limited to the one method the same as the first embodiment, but may instead employ a pulse having a suitable voltage amplitude. Further, when the electric field in the gate oxidation film between the gate and source, and between the gate and drain of the MOS transistors, as related in the second embodiment, does not exceed the maximum electric field Eox max, then the circuit structure need not include the oxide-stress relaxation transistors Mp2, Mn5. Further by sharing (consolidating) the main word lines MWLbp, MWLbn shown in FIG. 16 when the electric field in the gate oxidation film is sufficiently small, the sub-word driver can be driven by one main word line and an increase in the surface area of the circuit thus be prevented. Still further, in the common sub-word driver shown in FIG. 19, instead of the method for controlling the common word line by using the read control signal φr as described in the first embodiment, a write control signal φwb can be utilized for controlling the common word lines.

<Fourth Embodiment>

Figure 20:
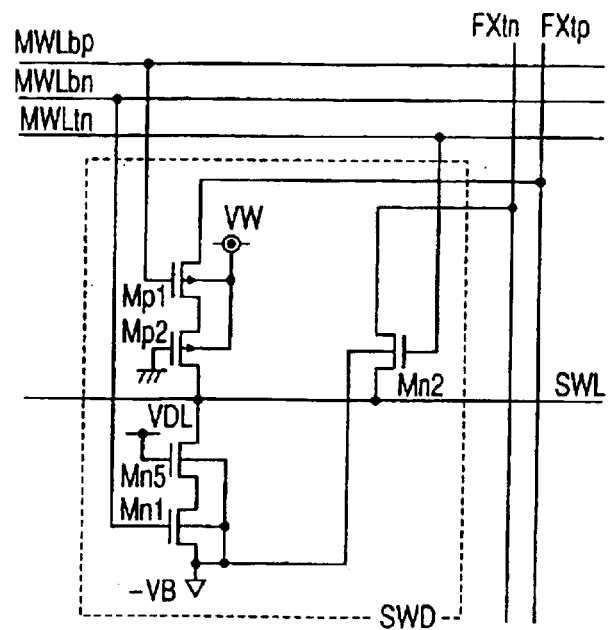
FIG. 20 is a circuit diagram for the sub-word driver for generating the three value voltage levels of the fourth embodiment.

Yet another structure of the sub-word driver as shown in FIG. 20 is described.

The sub-word driver SWD of this embodiment differs from the sub-word driver shown in FIG. 16, in being characterized that the source electrode of the NMOS transistor Mn2 is connected to the common word line FXtn, without being connected to standby voltage −VB. The main word line signal handles the PMOS transistor Mp1 and the NMOS transistor Mn1 separately, and connects the main word line MWLbp to the gate of PMOS transistor Mp1, and the main word line MWLbn to the gate of the NMOS transistor Mn1. Also, the main word line MWLtn is connected to the gate of the NMOS transistor Mn2. The common word line also handles the PMOS transistor Mp1 and the NMOS transistor Mn2 separately, and the common word line FXtp is connected to the source of the PMOS transistor, and the common word line FXtn is connected to the source of the NMOS transistor Mn2. The source of the NMOS transistor Mn1 is connected to the standby voltage −VB. The PMOS transistor Mp2 and the NMOS transistor Mn5 are oxide-stress relaxation MOS transistors, and a fixed voltage is applied to the gate electrode. An example respectively applying both ground potential VSS and supply voltage VDL is shown in FIG. 20. The sub-word line SWL is connected to the drains of the transistor Mp2, Mn2 as well as Mn5. By utilizing this type of circuit structure, the problem of breakdown voltage in the gate oxidation film can be resolved, and a sub-word driver comprised of three main word lines and two common word lines as well as five MOS transistors. This circuit configuration is also characterized in that the voltage potential on the common word line Fxtp connected to the source of the PMOS transistor Mp1 is controlled according to the read operation and write operation, to generate word line voltages of three values.

A circuit configured as described here can adequately achieve the objects of the invention without utilizing the transistors Mp2 and Mn5.

Figure 21:
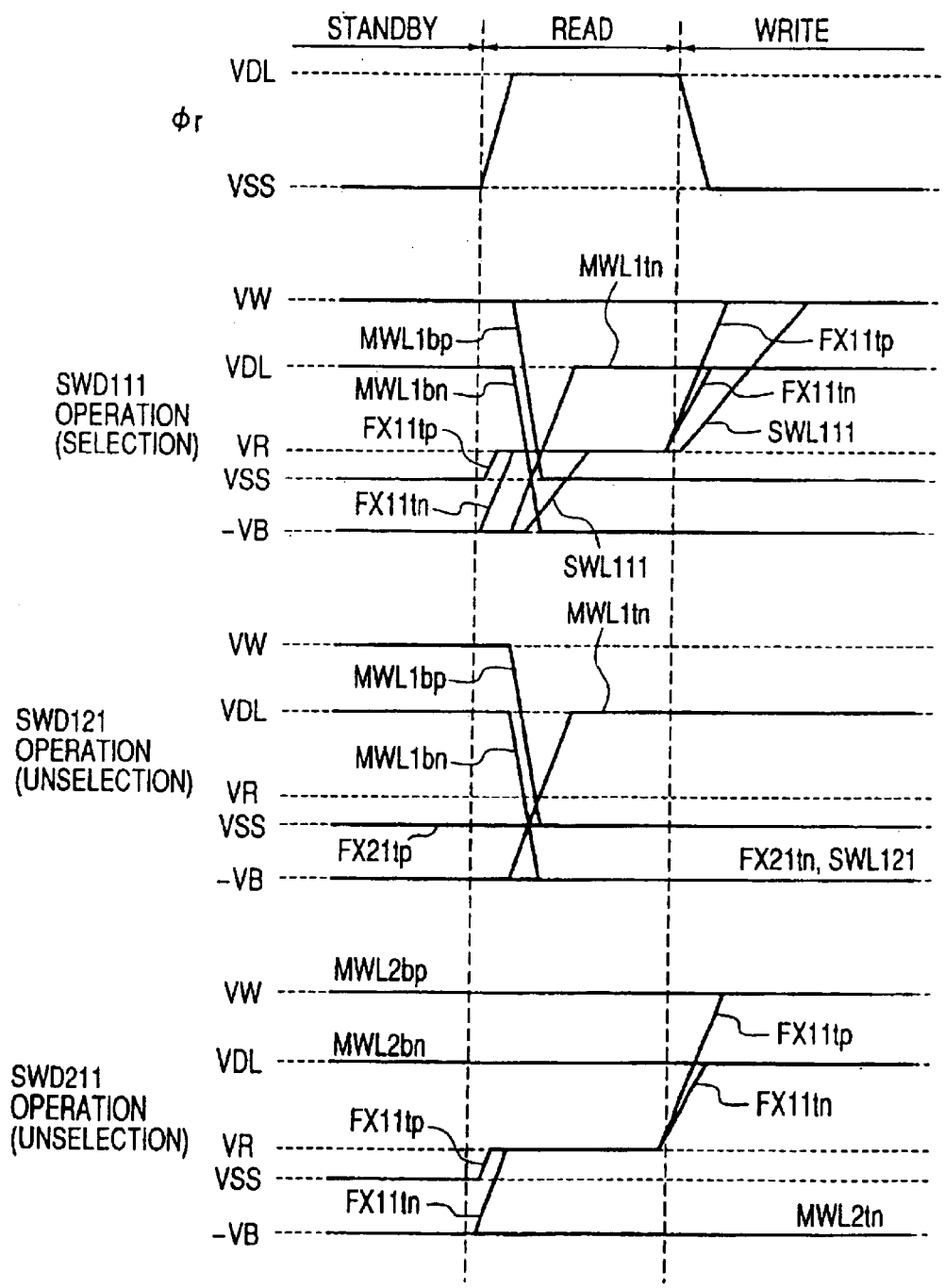
FIG. 21 shows operation timing diagrams of the sub-word driver for generating the three value voltage levels of the fourth embodiment.

The operation of the sub-word driver SWD of FIG. 20 is next described according to FIG. 21. The sub-word line SWL111 in this figure is shown when in the selected state, and changes from standby state to read operation and write operation occur consecutively. The point differing from the first embodiment is that the selected word driver such as the main word driver MWD1, in either the read operation or write operation, the main word lines MWLbp, MWLbn and MWLtn are respectively driven to ground level VSS, standby voltage −VB, and supply voltage VDL. The main word driver MWD1 respectively drives the main word line MWL1*bp* from write voltage VW to ground potential VSS, the main word line MWL1*bn* from the supply voltage VDL to standby voltage −VB, and the main word line MWL1*tn* from standby voltage −VB to the supply voltage VDL. In this state, first of all, when the read control signal φr at ground potential VSS is driven to the supply voltage level VDL to reach read operation, the common word driver FXD11 drives the common word lines FX11*tp*, FX11*tn*, respectively from ground potential VSS and standby voltage −VB to the read voltage VR. The main word lines MWLbp, MWLbn and MWLtn1 are respectively driven to ground potential VSS, standby voltage −VB and to supply voltage VDL, and the common word lines FX11*tp*, FX11*tn* are respectively driven to the read voltage VR, so that the transistor Mn1 sets to cutoff state, the transistors Mp1, Mp2 conduct, the sub-word driver SWD111 is selected, and the sub-word line SWL111 is driven from standby voltage −VB to the read voltage −Vr.

Next, when the read control signal φr at supply voltage VDL is driven to the ground potential VSS, the common word driver FXD11 drives the common word line FX11*tp* from read voltage VR to the write voltage VW, and the common word line FX11*tn* to the supply voltage VDL. The main word lines MWLbp, MWLbn and MWLtn1 are therefore respectively driven to ground potential VSS, standby voltage −VB and to supply voltage VDL and held in those states, and the common word lines FX11*tp*, FX11*tn* are respectively driven to the write voltage VW and the supply voltage VDL so that the Mn1 and Mn2 reach the cutoff state, the transistor Mp1 conducts and the sub-word driver SWD111 is selected, and the sub-word line SWL111 is driven from read voltage VR to the write voltage VW.

The main word lines MWLbp and MWLbn connected to the sub-word driver shown in FIG. 20, are respectively driven by the main word driver MWD, and the common word driver lines FXtp, FXtn are driven by the common word driver FXD as shown below.

Figure 22:
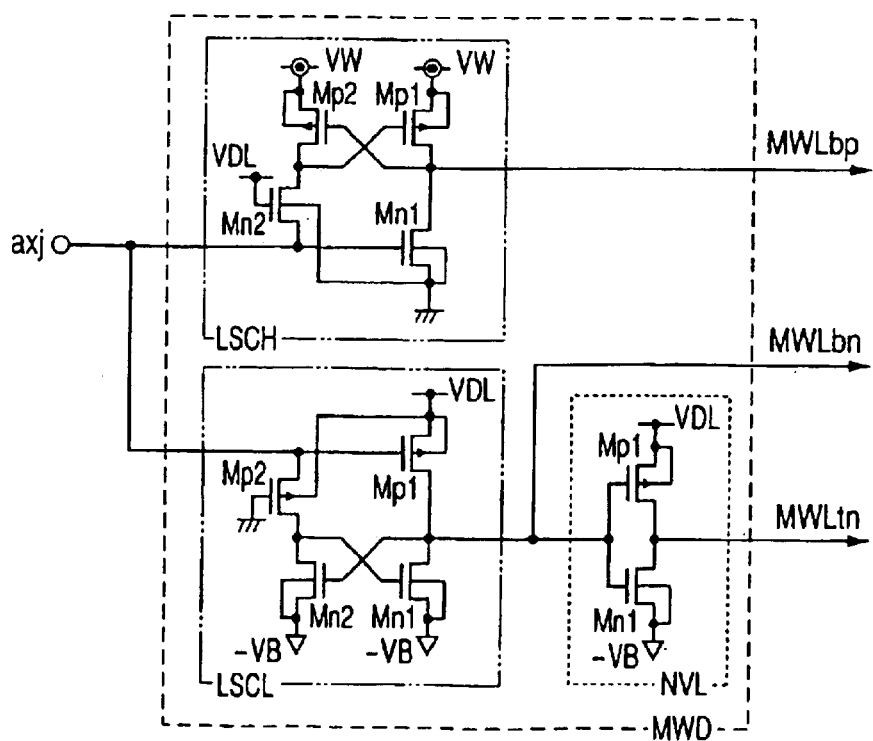
FIG. 22 is a circuit diagram of the main word driver of the fourth embodiment.

The operation of the main word driver of FIG. 22 is explained next. Just the same as in the operation described for FIG. 21, a read/write control circuit is not required in the common word driver in the fourth embodiment for executing control according to the read operation and write operation. The main word driver MWD is therefore comprised of level shift circuits to independently drive the main word lines MWLbp, MWLbn, and an inverter circuit NVL to drive the main word line MWLtn. In other words, the decode signal axj is input to the level shift circuit LSCH, LSCL, and the respective outputs used for the main word lines MWLbp and MWLbn. The main word line MWLbn is connected to the inverter circuit NVL, and that output is used for the main word line MWLtn. The decode signal axj is selected by reaching the supply voltage level VDL, the main word line MWLbp at the write voltage VR is driven to ground potential VSS, the main word line MWLbn at the supply voltage VDL is driven to the standby voltage −VB, and the main word line MWLtn at the standby voltage −VB is driven to the supply voltage VDL.

Figure 23:
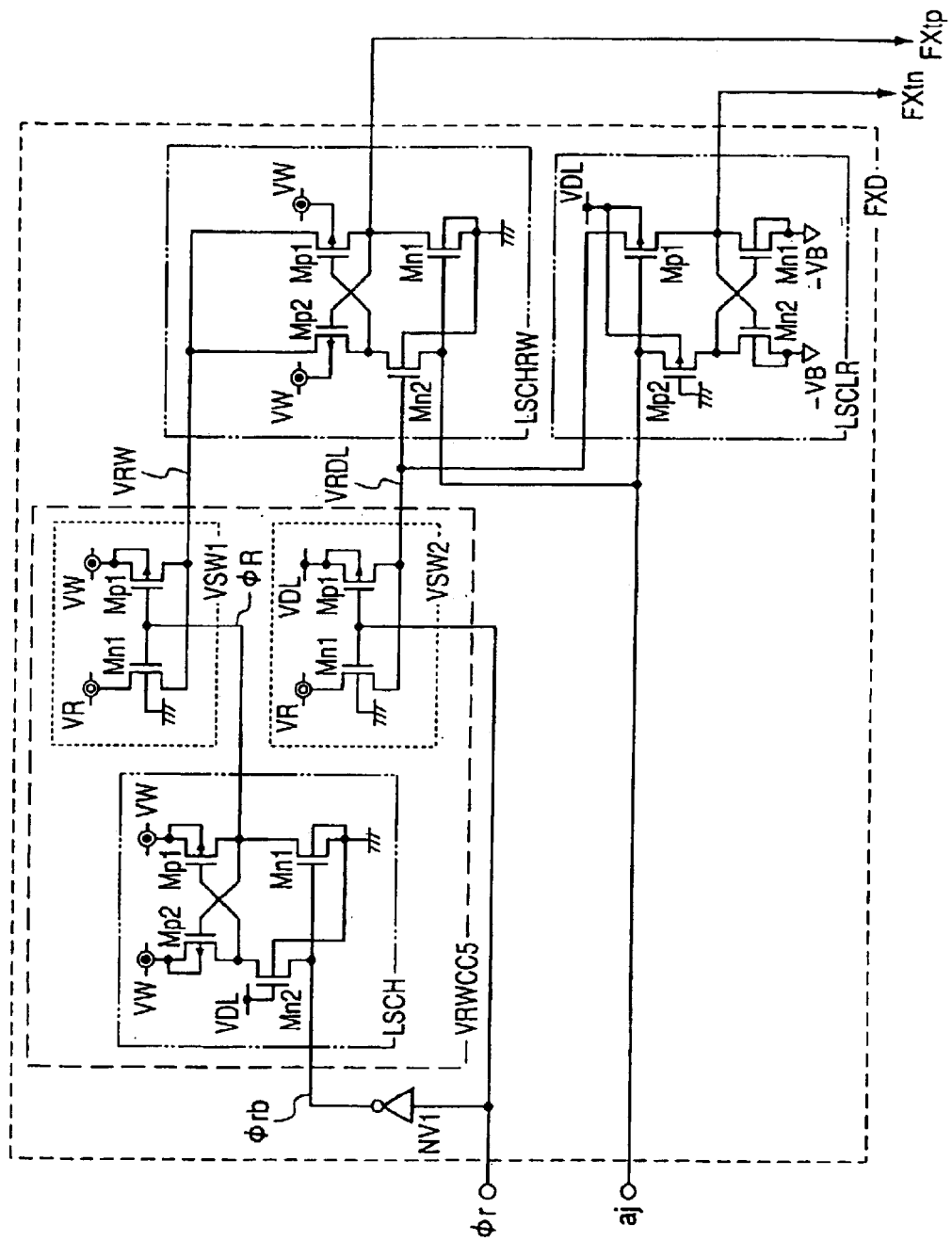
FIG. 23 is a circuit diagram of the common word driver of the fourth embodiment.

The operation of the common word driver shown in FIG. 23 is described next. The common word driver FXD is comprised of the level shift circuits LSCHRW and LSCLR to separately drive the common word lines FXtp, FXtn, and the read/write voltage control circuit VRWCC5 and inverter control circuit NV1. The point differing from the common word driver of the third embodiment shown in FIG. 19 is that the inverter circuit NVL2 is eliminated since the polarity of common word line FXnb is the same as the common word line FXnt reversed polarity, and the decode signal aj is input as is, to the level shift circuit LSCLR. Also, the level shift circuit LSCLR, unlike the level shift circuit LSCL of the first embodiment, is input at the source of transistor Mp1 with a cutoff voltage VRDL. A common word driver FXD of this type is therefore selected when the decode signal aj reaches ground potential VSS, and the common word line FXnt at standby voltage −VB is driven to the read voltage VR for read operation, and to the supply voltage VDL for write operation. The operation of the common word line FXtp is the same as the common word driver of the third embodiment shown in FIG. 19.

Therefore, the same as in the common word driver of the third embodiment shown in FIG. 19, the common word driver of this embodiment shown in FIG. 23, is characterized by driving the common word line FXtp to three voltage levels while switching the cutoff voltage VRDL according to the changed voltages in order to prevent DC current from flowing in the level shift circuit LSCHRW. Also, the sub-word driver is characterized in that in order to control the transistor Mn2, the common word line FXtn is driven to three word lines: a standby voltage −VB, a read voltage VR and a supply voltage VDL. In the preferred voltage settings for the capacitive coupling 2-transistor DRAM shown in FIG. 6, when the read voltage VR is sufficiently larger than the threshold voltage of transistor Mn2, and the drive performance of transistor Mn2 is sufficiently large, the gate voltage for transistor Mn2 in the level shift circuit LSCHRW, may be fixed at the read voltage VR. Also, in the voltage switcher circuit VSW1, the read/write voltage VRW is driven by two different positive voltages, by way of the transistors Mp1 and transistor Mn1 having different well structures, so that the occurrence of a latchup is prevented when power is turned on, and a write voltage VW definitely higher than the supply voltage VDL can be generated.

A summary of the sub-word driver shown in FIG. 20 is next explained. By utilizing the common word driver FXD shown in FIG. 23, the sub-word driver shown in FIG. 20 for outputting three voltage values can be comprised by five MOS transistors. Also, the circuit structure of this portion is simple since it is comprised by three main word lines and two common word lines, and the surface area can therefore be kept small.

By utilizing the circuit shown in this embodiment with the preferred voltage settings for the capacitive coupling 2-transistor DRAM shown in FIG. 6, the breakdown voltage problem in the gate oxidation film can be resolved, as is easily understood from the description of the first embodiment. Alternatively, the method utilizing n+si gates in the PMOS transistors Mp1, Mp2 described in the first embodiment, or the method for suitably amplifying the level-shifted main word line signal and common word line signal, can also be applied to the circuits shown in this embodiment. Also, the application of a fixed level voltage to the gates of the oxide-stress relaxation transistors Mp2, Mn5, is not limited to the one method the same as the first embodiment, but may instead employ a pulse having a suitable voltage amplitude. Further, when the electric field in the gate oxidation film between the gate and source, and between the gate and drain of the MOS transistors, as related in the second embodiment, does not exceed the maximum electric field Eox max, then the circuit structure need not include the oxide-stress relaxation transistors Mp2, Mn5. Further by sharing (consolidating) the main word lines MWLbp, MWLbn shown in FIG. 20 when the electric field in the gate oxidation film is sufficiently small, the sub-word driver can be driven by two main word lines and two common word lines and an increase in the surface area of the circuit thus be prevented. Still further, in the common sub-word driver shown in FIG. 23, instead of the method for controlling the common word lines by using the read control signal φr as described in the first embodiment, a write control signal φwb can be utilized for controlling the common word lines.

Various embodiments conforming to this invention were described above however this invention is not limited to these structures and the same effect can be also obtained by different variations and applications. For instance, the use of a hierarchical word line structure in this invention was explained, however this invention is also applicable to the case of using a conventional word line structure with the word driver controlled directly by a low decoder. This invention was also described with the hierarchical word line structure shown in FIG. 7 with the capacitive coupling 2-transistor cell of FIG. 5, and was further described using a memory cell with a hierarchical word line structure to control the read/write operation at three word line voltages, as typified in the three-transistor cell shown in FIG. 4, however various adaptations and applications of this invention are possible for driving the selected sub-word lines to voltages of three values, while sufficiently reducing the voltage applied to the gate oxidation film of the MOS transistors in each circuit.

The above embodiments were also explained for the case when the threshold voltage VTR of the read transistor QR was lower than the threshold voltage VTW of the write transistor QW, clearly however, the same reasoning is also valid if the relation of the read transistor QR threshold voltage VTR and the transistor QW threshold voltage VTW are interchanged. In such a case, the data lines for read and for write can be isolated and controlled as needed, and the memory cell read operation can be performed by setting the read voltage to VW and the write voltage to VR. At this time, the main word driver, the common word driver and the sub-word driver, may be configured to drive the sub-word line to read voltage and to the write voltage, while appropriately controlling the read/write control circuit shown in the various embodiments.

The explanation for the above embodiments also described configuring a memory cells using NMOS transistors however clearly, same reasoning is also valid if the memory cells are comprised using PMOS transistors. In such a case, along with interchanging the PMOS and NMOS transistors in the sub-word driver, the power supply voltage relation such as for the supply voltage, main word lines and also the common word lines may also be reversed, and the non-select sub-word line voltage set higher than the high level data line, and the select sub-word line voltage set lower than the data line low level.

The invention as described above therefore reduces the problem of breakdown voltage in the MOS transistors and provides a DRAM for controlling read and write at three values of word line voltages.

What is claimed is:

1. A semiconductor device comprising:
   a plurality of memory cells coupled to a plurality of word lines and a plurality of data lines; and
   a plurality of word drivers controlling voltages (SWL) applied to said plurality of word lines,
   wherein a voltage applied to one of said plurality of word lines for a read operation is lower than a voltage applied to one of said plurality of word lines for a write operation, wherein said voltage applied to one of said plurality of word lines for said read operation is higher than a voltage applied to one of said plurality of word lines which are not selected for either said read operation or said write operation, and wherein said plurality of memory cells each comprises at least a transistor having a gate coupled to said one of said plurality of word lines, and having a source/drain path between one of said plurality of data lines and a node supplied with a predetermined voltage.

2. The semiconductor device according to claim 1, wherein a voltage applied to said plurality of word lines during a precharge operation is lower than a ground voltage.

3. The semiconductor device according to claim 1, wherein said voltage applied to one of said plurality of word lines for said read operation is lower than a voltage of one selected data line of said plurality of data lines.

4. The semiconductor device according to claim 3, wherein said voltage applied to one of said plurality of word lines for said write operation is higher than said voltage of one selected data line of said plurality of data lines.

5. The semiconductor device according to claim 4, wherein said plurality of memory cells are dynamic memory cells.

6. A semiconductor device comprising:

a plurality of memory cells coupled to a plurality of word lines and a plurality of data lines; and a plurality of word drivers controlling voltage applied to said plurality of word lines;

wherein a first voltage applied to one of said plurality word lines for a read operation is lower than a second voltage applied to one of said plurality of word lines for a write operation, wherein said first voltage is higher than a third voltage applied to one of said plurality of word lines which are not selected for either said read operation or write operation, wherein each of said plurality of word drivers includes a first MOS transistor having a source and a drain which are coupled between a corresponding one of said plurality of word lines and said first voltage, a second MOS transistor having a source and a drain which are coupled between a corresponding one of said plurality of word lines and said second voltage, and a third MOS transistor having a source and a drain which are coupled between a corresponding one of said plurality of word lines and said third voltage.

7. The semiconductor device according to claim 6, wherein said plurality of memory cells each comprises at least a transistor having a gate coupled to said one of said plurality of word lines, and having a source/drain path between one of said plurality of data lines and a node supplied with a predetermined voltage.

8. The semiconductor device according to claim 6 wherein a voltage applied to said plurality of word lines during a precharge operation is lower than a ground voltage.

9. The semiconductor device according to claim 8, wherein said voltage applied to one of said plurality of word lines for said read operation is lower than a voltage of one selected data line of said plurality of data lines.

10. The semiconductor device according to claim 9, wherein said voltage applied to one of said plurality of word lines for said write operation is higher than said voltage of one selected data line of said plurality of data lines.

11. The semiconductor device according to claim 9, wherein said plurality of memory cells are dynamic memory cells.

\* \* \* \* \*